US012563908B2

(12) United States Patent
Du et al.

(10) Patent No.:     US 12,563,908 B2
(45) Date of Patent:          Feb. 24, 2026

(54) DISPLAY PANEL AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Mengmeng Du, Beijing (CN); Cong Fan, Beijing (CN); Yujing Li, Beijing (CN); Yu Wang, Beijing (CN); Fan He, Beijing (CN); Xiangdan Dong, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 562 days.

(21) Appl. No.:     18/043,604

(22) PCT Filed:     Apr. 29, 2022

(86) PCT No.:        PCT/CN2022/090400
§ 371 (c)(1),
(2) Date:        Mar. 1, 2023

(87) PCT Pub. No.: WO2023/206399
PCT Pub. Date: Nov. 2, 2023

(65)              Prior Publication Data
US 2023/0403882 A1      Dec. 14, 2023

(51) Int. Cl.
*H10K 59/122*           (2023.01)

(52) U.S. Cl.
CPC .................................. *H10K 59/122* (2023.02)

(58) Field of Classification Search
None
See application file for complete search history.

(56)                References Cited

U.S. PATENT DOCUMENTS

| | | | |
|---|---|---|---|
| 11,164,920 B2 * | 11/2021 | Zhang ................ | H10K 59/8731 |
| 2017/0331058 A1 * | 11/2017 | Seo ...................... | G02B 5/3016 |
| 2021/0234122 A1 * | 7/2021 | Choi ....................... | H02P 11/04 |
| 2022/0352285 A1 * | 11/2022 | Shi ........................ | G09G 3/3233 |
| 2024/0276779 A1 * | 8/2024 | Xu ..................... | H10K 59/1315 |

* cited by examiner

*Primary Examiner* — Michelle Mandala
(74) *Attorney, Agent, or Firm* — Westman, Champlin & Koehler, P.A.

(57)              ABSTRACT

A display panel including: a base substrate including a display region and a peripheral region, wherein the display region includes an outer boundary; a first electrode layer, a pixel defining layer and a photo spacer layer sequentially arranged on the base substrate. The display panel further includes at least one barrier dam arranged on the base substrate, which is located on a side of the peripheral region away from the display region in the peripheral region. The photo spacer layer includes a plurality of first photo spacers and second photo spacers respectively arranged in an array in the display region and the peripheral region, and the second photo spacer is located between the outer boundary and the at least one barrier dam. A distribution density of the second photo spacers in the peripheral region is less than that of the first photo spacers in the display region.

20 Claims, 14 Drawing Sheets

DISPLAY PANEL AND DISPLAY DEVICE

CROSS REFERENCE TO RELATED APPLICATIONS

This application is a Section 371 National Stage Application of International Application No. PCT/CN2022/090400, filed on Apr. 29, 2022, entitled "DISPLAY PANEL AND DISPLAY DEVICE", the whole disclosure of which is incorporated herein by reference in its entirety.

TECHNICAL FIELD

The present disclosure relates to a field of display technology, and in particular, to a display panel and a display device.

BACKGROUND

With a continuous development of a display technology, an Organic Light-Emitting Diode (OLED) display panel has been increasingly used in various electronic devices due to advantages of a self-illumination, a wide viewing angle, a high contrast, a low power consumption, a high reaction speed, etc. of the Organic Light-Emitting Diode display panel. At present, in the OLED display panel and a display device, a Photo Spacer (PS for short) is usually fabricated on a pixel defining layer to prevent a direct contact between a fine metal mask and a pixel structure during an evaporation process of an OLED organic light-emitting material, resulting in a scratch of the pixel structure and a generation of defects.

The above-mentioned information disclosed in the section is only used to understand a background of the inventive concept of the present disclosure. Therefore, the above-mentioned information may contain an information that does not constitute the prior art.

SUMMARY

In an aspect, a display panel is provided, including: a base substrate including a display region and a peripheral region, wherein the display region includes an outer boundary; a plurality of sub-pixels arranged in the display region, wherein the plurality of sub-pixels are arranged in an array in a first direction and a second direction in the display region, and at least one of the sub-pixels includes a first electrode, a second electrode and a functional layer located between the first electrode and the second electrode; a first electrode layer arranged on the base substrate, wherein the first electrodes of the plurality of sub-pixels are located in the first electrode layer; a pixel defining layer arranged on a side of the first electrode layer away from the base substrate; and a photo spacer layer arranged on a side of the pixel defining layer away from the base substrate, wherein the display panel further includes at least one barrier dam arranged on the base substrate, and the at least one barrier dam is located on a side of the peripheral region away from the display region in the peripheral region; wherein in the first direction and the second direction, the outer boundary is adjacent to an outermost row of sub-pixels located in the display region, and the outermost row of sub-pixels located in the display region faces a side of the peripheral region; wherein the photo spacer layer includes a plurality of first photo spacers and a plurality of second photo spacers, the plurality of first photo spacers are arranged in an array in the display region, the plurality of second photo spacer are arranged in an array in the peripheral region, and the plurality of second photo spacers are located between the outer boundary and the at least one barrier dam; and wherein a distribution density of the plurality of second photo spacers in the peripheral region is less than a distribution density of the plurality of first photo spacers in the display region.

According to some exemplary embodiments, two first photo spacers adjacent to each other in the first direction are spaced by a first distance in the first direction, two second photo spacers adjacent to each other in the first direction are spaced by a second distance in the first direction, and the first distance is less than the second distance; and/or wherein two first photo spacers adjacent to each other in the second direction are spaced by a third distance in the second direction, two second photo spacers adjacent to each other in the second direction are spaced by a fourth distance in the second direction, and the third distance is less than the fourth distance.

According to some exemplary embodiments, an outermost row of second photo spacers are spaced from the at least one barrier dam.

According to some exemplary embodiments, the display panel further includes a drive voltage lead line arranged in the peripheral region on the base substrate, and the drive voltage lead line is configured to transmit a drive voltage; and wherein an orthographic projection of at least one of the plurality of second photo spacers on the base substrate at least partially overlaps with an orthographic projection of the drive voltage lead line on the base substrate.

According to some exemplary embodiments, the peripheral region includes a first side peripheral region and a second side peripheral region, and the first side peripheral region and the second side peripheral region are located on two sides of the display region in the first direction, respectively; wherein the display panel further includes a scan drive circuit located in at least one of the first side peripheral region and the second side peripheral region on the base substrate, and the scan drive circuit is configured to output a scan signal; wherein the peripheral region includes a scan drive circuit region, the scan drive circuit region is located in at least one of the first side peripheral region and the second side peripheral region, the scan drive circuit is arranged in a scan drive circuit region, and the scan drive circuit region is located between the drive voltage lead line and the at least one barrier dam; and wherein an orthographic projection of at least one of the plurality of second photo spacers on the base substrate at least partially overlaps with an orthographic projection of the scan drive circuit region on the base substrate.

According to some exemplary embodiments, a plurality of scan drive circuit regions are arranged in at least one of the first side peripheral region and the second side peripheral region; and wherein the orthographic projection of at least one of the plurality of second photo spacers on the base substrate at least partially overlaps with an orthographic projection of each of the plurality of scan drive circuit regions on the base substrate.

According to some exemplary embodiments, the display panel further includes a first voltage lead line and an auxiliary conductive portion, the first voltage lead line is configured to provide a first voltage, the auxiliary conductive portion and the first electrode are located in a same layer, and a part of the auxiliary conductive portion is in direct contact with the first voltage lead line; and wherein the orthographic projection of at least one of the plurality of second photo spacers on the base substrate at least partially overlaps with an orthographic projection of the first voltage lead line on the base substrate; and/or, the orthographic projection of at least one of the plurality of second photo spacers on the base substrate at least partially overlaps with an orthographic projection of the auxiliary conductive portion on the base substrate.

According to some exemplary embodiments, the pixel defining layer includes a pixel defining layer body, the pixel defining layer body includes a first part and a second part, the first part is located in the display region and includes openings corresponding to the plurality of sub-pixels, and an orthographic projection of the openings on the base substrate is located within an orthographic projection of the first electrodes of the plurality of sub-pixels on the base substrate; the second part is located in the peripheral region, and the second part and the first part are an integrated structure; and the pixel defining layer body includes an outer side boundary away from the display region; wherein the peripheral region includes a first side peripheral region and a second side peripheral region, and the first side peripheral region and the second side peripheral region are located on two sides of the display region in the first direction, respectively; and wherein in at least one of the first side peripheral region and the second side peripheral region, the orthographic projection of at least one of the plurality of second photo spacers on the base substrate is located on a side of the outer side boundary of the pixel defining layer body close to the display region, and an orthographic projection of at least another one of the plurality of second photo spacers on the base substrate is located on a side of the outer side boundary of the pixel defining layer body away from the display region.

According to some exemplary embodiments, for the second photo spacers located on a side of the outer side boundary of the pixel defining layer body close to the display region in at least one of the first side peripheral region and the second side peripheral region, in two adjacent rows of second photo spacers, a spacing distance between two second photo spacers adjacent to each other in the first direction in a row of second photo spacers is not equal to a spacing distance between two second photo spacers adjacent to each other in the first direction in the other row of second photo spacers.

According to some exemplary embodiments, for the second photo spacers located on a side of the outer side boundary of the pixel defining layer body close to the display region in at least one of the first side peripheral region and the second side peripheral region, in two adjacent rows of second photo spacers, a spacing distance between two second photo spacers adjacent to each other in the first direction in a row of second photo spacers is substantially equal to a spacing distance between two second photo spacers adjacent to each other in the first direction in the other row of second photo spacers.

According to some exemplary embodiments, the display panel further includes a planarization layer, and the planarization layer is located on a side of the first electrode layer close to the base substrate; wherein in at least one of the first side peripheral region and the second side peripheral region, the auxiliary conductive portion includes a plurality of first openings, and the plurality of first openings respectively expose a part of the planarization layer; and the pixel defining layer further includes a first covering portion, and the first covering portion covers the plurality of first openings; and wherein an orthographic projection of at least one of the plurality of second photo spacers on the base substrate at least partially overlaps with an orthographic projection of the first covering portion on the base substrate.

According to some exemplary embodiments, the peripheral region includes a third peripheral region, and the third peripheral region is located on a side of the display region in the second direction; wherein in the third side peripheral region, the pixel defining layer further includes a second covering portion, the auxiliary conductive portion includes a plurality of second openings, the plurality of second openings respectively expose a part of the planarization layer, and the second covering portion covers the plurality of second openings; and wherein in the third side peripheral region, the orthographic projection of at least one of the plurality of second photo spacers on the base substrate at least partially overlaps with an orthographic projection of the second covering portion on the base substrate.

According to some exemplary embodiments, in the third side peripheral region, the pixel defining layer further includes a third covering portion, the auxiliary conductive portion includes a plurality of third openings, the plurality of third openings respectively expose a part of the planarization layer, and the third covering portion covers the plurality of third openings.

According to some exemplary embodiments, in the third side peripheral region, the orthographic projection of at least one of the plurality of second photo spacers on the base substrate does not overlap with an orthographic projection of the plurality of third openings on the base substrate.

According to some exemplary embodiments, the peripheral region includes a fourth peripheral region, and the fourth peripheral region is located on the other side of the display region in the second direction; wherein in the fourth side peripheral region, the pixel defining layer further includes a fourth covering portion, the auxiliary conductive portion includes a plurality of fourth openings, the plurality of fourth openings respectively expose a part of the planarization layer, and the fourth covering portion covers the plurality of fourth openings; and wherein in the fourth side peripheral region, the orthographic projection of at least one of the plurality of second photo spacers on the base substrate at least partially overlaps with an orthographic projection of the fourth covering portion on the base substrate.

According to some exemplary embodiments, at least one row of second photo spacers located in at least one of the first side peripheral region and the second side peripheral region are substantially aligned with at least one row of first photo spacers located in the display region in the first direction, respectively.

According to some exemplary embodiments, at least one column of second photo spacers located in the third side peripheral region are substantially aligned with at least one column of first photo spacers located in the display region in the second direction, respectively.

According to some exemplary embodiments, the peripheral region includes a fourth peripheral region, and the fourth peripheral region is located on the other side of the display region in the second direction; and wherein in the first side peripheral region, the second side peripheral region, the third side peripheral region and the fourth side peripheral region, spacing distances between an orthographic projection of the outermost row of second photo spacers on the base substrate and an orthographic projection of the at least one barrier dam on the base substrate are substantially equal to each other.

According to some exemplary embodiments, a spacing distance between an orthographic projection of the outermost row of second photo spacers on the base substrate and an orthographic projection of the at least one barrier dam on the base substrate is in a range of 300 microns to 1000 microns.

According to some exemplary embodiments, the distribution density of the plurality of second photo spacers in the peripheral region is ¼ to ⅔ of the distribution density of the plurality of first photo spacers in the display region.

According to some exemplary embodiments, the plurality of sub-pixels includes a first sub-pixel, a second sub-pixel and a third sub-pixel, the pixel defining layer body includes openings corresponding to the plurality of sub-pixels in the display region, an orthographic projection of the openings on the base substrate is located within an orthographic projection of the first electrodes of the plurality of sub-pixels on the base substrate, and an area of the orthographic projection of the opening corresponding to the third sub-pixel on the base substrate is greater than an area of the orthographic projection of the opening corresponding to the first sub-pixel or the second sub-pixel on the base substrate; and wherein the first photo spacer is adjacent to the opening corresponding to the third sub-pixel in the second direction.

According to some exemplary embodiments, the display panel further includes an encapsulation layer arranged on a side of the at least one barrier dam away from the base substrate, and the encapsulation layer includes a first inorganic layer, an organic layer and a second inorganic layer stacked in sequence; and wherein an orthographic projection of the organic layer on the base substrate is located on a side of an orthographic projection of the at least one barrier dam on the base substrate close to the display region, and the at least one barrier dam is configured to block a flow of an organic solution configured to form the organic layer in a direction from the display region to the peripheral region.

In another aspect, a display device is provided, including the display panel described above.

BRIEF DESCRIPTION OF THE DRAWINGS

Other objectives and advantages of the present disclosure will be apparent through following descriptions of the present disclosure in combination with the accompanying drawings, which may facilitate a comprehensive understanding of the present disclosure.

Figure 1:
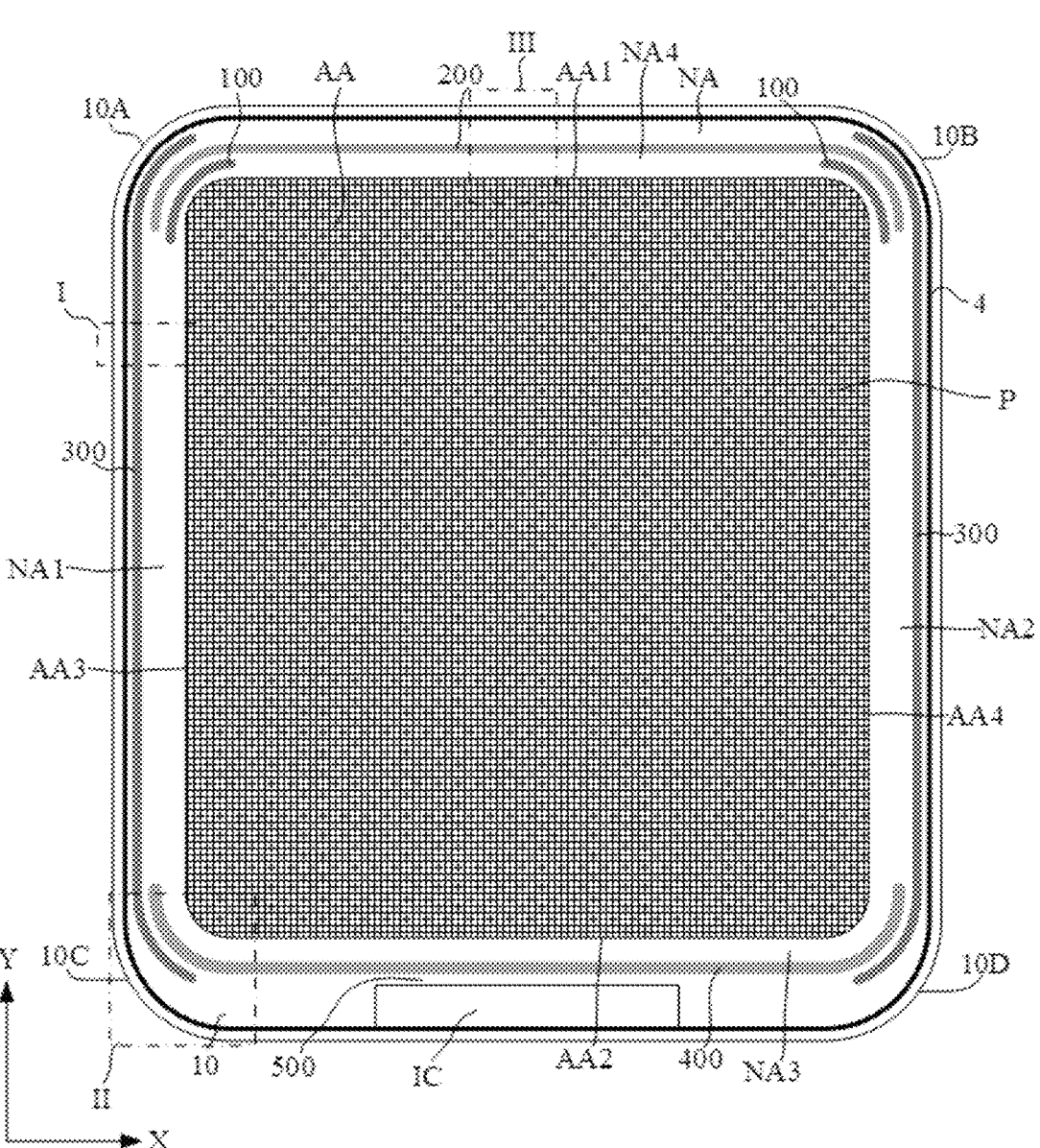
FIG. 1 is a schematic plan view of a display device according to some exemplary embodiments of the present disclosure.

It should be noted that, for the sake of clarity, in the accompanying drawings used to describe embodiments of the present disclosure, sizes of layers, structures or regions may be enlarged or reduced, that is, the accompanying drawings are not drawn to actual scale.

DETAILED DESCRIPTION OF EMBODIMENTS

In the following descriptions, for the purpose of explanation, many specific details are set forth to provide a comprehensive understanding of various exemplary embodiments. However, it is obvious that various exemplary embodiments may be implemented without the specific details, or with one or more equivalent arrangements. In other cases, well-known structures and devices are shown in a form of a block diagram to avoid unnecessarily obscuring various exemplary embodiments. In addition, the various exemplary embodiments may be different, but need not be exclusive. For example, without departing from the inventive concept, a specific shape, configuration and characteristic of an exemplary embodiment may be used or implemented in another exemplary embodiment.

In the accompanying drawings, a size and a relative size of an element may be enlarged for the purpose of clarity and/or description. In this way, the size and the relative size of each element need not be limited to a size and a relative size shown in the drawings. When exemplary embodiments may be implemented differently, a specific process sequence may be performed in an order different from a described order. For example, two continuously described processes may be substantially performed simultaneously or in an order opposite to the described order. In addition, the same reference numerals indicate the same element.

When an element is described as being "on" another element, "connected to" another element or "coupled to" another element, the element may be directly on the another element, directly connected to the another element or directly coupled to the another element, or there may be an intermediate element. However, when an element is described as being "directly on" another element, "directly connected to" another element or "directly coupled to" another element, there is no intermediate element. Other terms and/or expressions used to describe a relationship between elements should be interpreted in a similar way, for example, "between" versus "directly between", "adjacent" versus "directly adjacent" or "above" versus "directly above", etc. In addition, a term "connection" may refer to a physical connection, an electrical connection, a communication connection and/or a fluid connection. In addition, an X axis, a Y axis and a Z axis are not limited to three axes of a rectangular coordinate system, and may be explained in a broader sense. For example, the X, Y, and Z axes may be perpendicular to each other, or may represent different directions that are not perpendicular to each other. For the purpose of the present disclosure, "at least one of X, Y and Z" and "at least one selected from a group consisting of X, Y and Z" may be interpreted as X only, Y only, Z only, or any combination of two or more of X, Y and Z, such as XYZ, XY, YZ and XZ. As used herein, a term "and/or" includes any combination and all combinations of one or more of the related items listed.

It should be noted that although terms "first", "second", etc., may be used here to describe various components, members, elements, regions, layers and/or parts, the components, members, elements, regions, layers and/or parts should not be limited by the terms. Instead, the terms are used to distinguish a component, a member, an element, a region, a layer and/or a part from another. Therefore, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "up", "down", "left", "right", etc., may be used here to describe a relationship between an element or feature and another element or feature as shown in the drawings. It should be understood that the spatial relationship terms are intended to cover other different orientations of a device in use or operation other than those described in the drawings. For example, when the device in the drawings is reversed, an element described as being located "under" or "below" another element or feature may be oriented to be located "on" or "above" the another element or feature.

Terms "substantially", "about", "approximately", "roughly" and other similar terms used herein are used as approximate terms rather than as terms of degree, and they are intended to explain an inherent deviation of a measured value or a calculated value that may be recognized by those skilled in the art. In consideration of factors such as a process fluctuation, a measurement problem and an error (i.e., a limitation on a measurement system) related to a measurement of a specific amount, the "about" or "approximately" used here includes a stated value, and means that a specific value determined by those skilled in the art falls within an acceptable deviation range. For example, the "about" may mean that the specific value is within one or more standard deviations, or within ±30%, ±20%, ±10%, ±5% of the stated value.

It should be noted that, an expression "same layer" used herein refers to a layer structure formed by forming a film layer for a formation of a specific pattern through one and the same film forming process, and then patterning the film layer by using one and the same mask through one-time patterning process. According to different specific patterns, the one-time patterning process may include a plurality of exposure, development or etching processes, and the specific pattern in the formed layer structure may be continuous or discontinuous. That is, a plurality of elements, components, structures and/or parts located in the "same layer" are made of a same material and formed by one and the same patterning process. Generally, the plurality of elements, components, structures and/or parts located on the "same layer" have a substantially same thickness.

An expression "distribution density" used herein refers to a quantity per unit area. For example, a distribution density of photo spacers may indicate a quantity of the photo spacers per unit area.

The inventors found through research that at present, in the OLED display panel and display device, a Photo Spacer (PS for short) is usually fabricated on a pixel defining layer to prevent a direct contact between a Fine Metal Mask (FMM for short) and a pixel structure during an evaporation process of an OLED organic light-emitting material, resulting in a scratch of the pixel structure and a generation of defects. In an actual production process, for some OLED display products, the FMM is designed to have a large through-hole, a sag of which is large under an influence of gravity, and a possibility of a large-area contact between the FMM and the display panel may be increased. In this case, in addition to a contact with a display region, the FMM may further be in contact with a peripheral region (i.e., a bezel region) of the display panel, which may result in other undesirable problems, such as a scratch of a GOA drive circuit provided in the peripheral region, a generation of electrostatic discharge (i.e., ESD) caused by a contact with a circuit, etc.

For at least one aspect of the above-mentioned problems, embodiments of the present disclosure provide a display panel and a display device. The display panel includes: a base substrate including a display region and a peripheral region, wherein the display region includes an outer boundary; a plurality of sub-pixels arranged in the display region, wherein the plurality of sub-pixels are arranged in the display region in an array in a first direction and a second direction, and at least one sub-pixel includes a first electrode, a second electrode and a functional layer located between the first electrode and the second electrode; a first electrode layer arranged on the base substrate, wherein the first electrodes of the plurality of sub-pixels are located in the first electrode layer; a pixel defining layer arranged on a side of the first electrode layer away from the base substrate; and a photo spacer layer arranged on a side of the pixel defining layer away from the base substrate, wherein the display panel further includes at least one barrier dam arranged on the base substrate, and the at least one barrier dam is located on a side of the peripheral region away from the display region in the peripheral region; in the first direction and the second direction, the outer boundary is adjacent to an outermost row of sub-pixels located in the display region, and the outermost row of sub-pixels located in the display region faces a side of the peripheral region; the photo spacer layer includes a plurality of first photo spacers and a plurality of second photo spacers, the plurality of first photo spacer are arranged in an array in the display region, the plurality of second photo spacer are arranged in an array in the peripheral region, and the plurality of second photo spacers are located between the outer boundary and the at least one barrier dam; and a distribution density of the plurality of second photo spacers in the peripheral region is less than a distribution density of the plurality of first photo spacers in the display region.

In embodiments of the present disclosure, a design of photo spacers is added in the peripheral region of the display panel, and the distribution density of the photo spacers in the peripheral region is less than the distribution density of the photo spacers in the display region. Through such design, on one hand, a contact between the FMM and the peripheral region of the display panel may be avoided, so as to avoid the problems, such as a scratch of a GOA drive circuit provided in a peripheral region, a generation of electrostatic discharge (i.e., ESD) caused by a contact with a circuit, etc.; on the other hand, since the photo spacers in the peripheral region have a less distribution density, a probability of a scratch between the FMM and the photo spacers may be reduced, thereby reducing a risk of generating many photo spacer particles.

Figure 2:
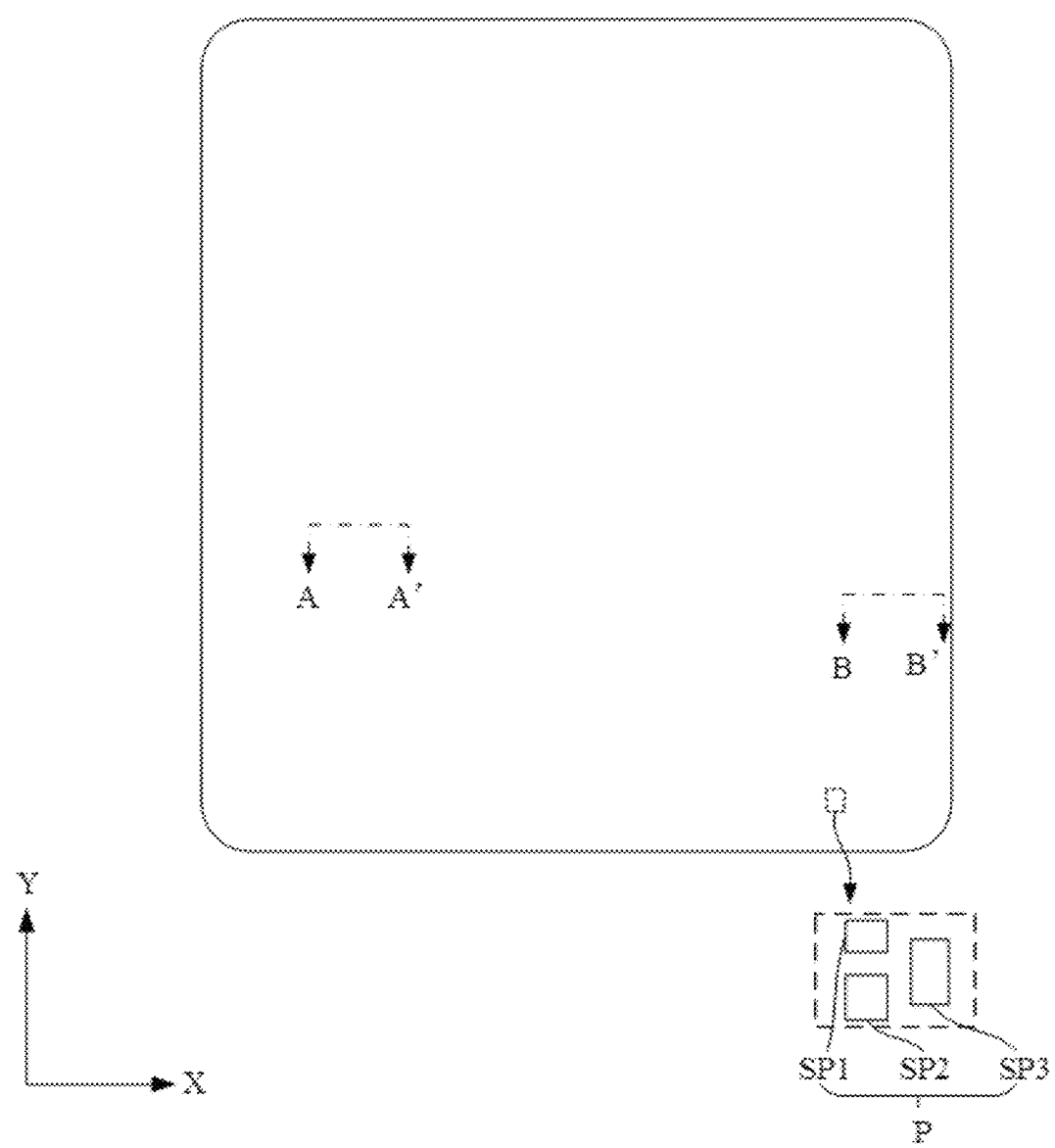
FIG. 2 is a schematic plan view of a display device according to some exemplary embodiments of the present disclosure, in which a pixel unit included in a display panel is schematically shown.

FIG. 1 is a schematic plan view of a display device according to some exemplary embodiments of the present disclosure. FIG. 2 is a schematic plan view of a display device according to some exemplary embodiments of the present disclosure, in which a pixel unit included in a display panel is schematically shown.

With reference to FIG. 1 and FIG. 2, a display device 1000 may include a display panel. The display panel may include a base substrate 10, and the base substrate 10 may include a display region AA and a peripheral region NA located on at least one side of the display region. It should be noted that in the embodiment shown in FIG. 1, the peripheral region NA surrounds the display region AA. However, embodiments of the present disclosure are not limited to this. In other embodiments, the peripheral region NA may be located on at least one side of the display region AA, but does not surround the display region AA.

The display panel may include a plurality of pixel units P located in the display region AA. It should be noted a pixel unit P is a smallest unit for displaying image. For example, the pixel unit P may include a light-emitting device that emits white light and/or color light.

A plurality of pixel units P may be provided to be arranged in an array in a row extending in a first direction (e.g., a row direction) X and a column extending in a second direction (e.g., a column direction) Y. However, embodiments of the present disclosure do not specifically limit an arrangement form of the pixel units P, and the pixel units P may be arranged in various forms. For example, the pixel units P may be arranged so that a direction inclined relative to the first direction X and the second direction Y becomes a column direction, and a direction intersecting with the column direction becomes a row direction.

A pixel unit P may include a plurality of sub-pixels. For example, a pixel unit P may include three sub-pixels, that is, a first sub-pixel SP1, a second sub-pixel SP2 and a third sub-pixel SP3. For another example, a pixel unit P may include four sub-pixels, that is, a first sub-pixel, a second sub-pixel, a third sub-pixel and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Each sub-pixel may include a light-emitting element and a pixel drive circuit used to drive the light-emitting element. For example, the first sub-pixel SP1 may include a first light-emitting element and a first pixel drive circuit used to drive the first light-emitting element, and the first light-emitting element may emit red light; the second sub-pixel SP2 may include a second light-emitting element and a second pixel drive circuit used to drive the second light-emitting element, and the second light-emitting element may emit green light; the third sub-pixel SP3 may include a third light-emitting element and a third pixel drive circuit used to drive the third light-emitting element, and the third light-emitting element may emit blue light.

For example, in an OLED display panel, the light-emitting element of the sub-pixel may include an anode, a light-emitting material layer and a cathode that are stacked. For example, a light-emitting region of the sub-pixel may be a region sandwiched between the anode and the cathode and corresponding to a part of the light-emitting material layer that is in contact with the anode and the cathode. For example, a pixel defining layer is formed on the anode, and the pixel defining layer includes an opening that exposes at least a part of the anode. The light-emitting material layer is at least partially formed in the opening of the pixel defining layer, and the cathode is formed above. The light-emitting region of the sub-pixel may be a region defined by the opening of the pixel defining layer. The light-emitting material layer may include, for example, one or more of a hole injection layer, a hole transport layer, a light-emitting layer, a hole barrier layer, an electron transport layer, an electron injection layer, etc., and may further include other functional film layers in addition to the above-mentioned layers. The layers may include an organic material, and may further include an inorganic material such as a quantum dot, etc.

Referring to FIG. 1, the display panel may include components, such as a load compensation unit 100, a test circuit 200, a scan drive circuit 300, a multiplexer 400, etc., that are located in the peripheral region NA.

The display region AA may include a first boundary AA1, a second boundary AA2, a third boundary AA3, and a fourth boundary AA4 (e.g., an upper boundary, a lower boundary, a left boundary, and a right boundary) connected in sequence. In embodiments of the present disclosure, the display region AA includes an outer boundary. For example, the outer boundary may include the first boundary AA1, the second boundary AA2, the third boundary AA3 and the fourth boundary AA4, that is, the first boundary AA1, the second boundary AA2, the third boundary AA3 and the fourth boundary AA4 are connected to each other to form the outer boundary. Specifically, in the first direction X and the second direction Y, the outer boundary is adjacent to an outermost row of sub-pixels located in the display region AA, and the outermost row of sub-pixels located in the display region AA faces a side of the peripheral region NA. For example, in the first direction X, the outer boundary is adjacent to a leftmost column of sub-pixels or a rightmost column of sub-pixels located in the display region AA, and the outer boundary is located on a left side of the leftmost column of sub-pixels located in the display region AA or on a right side of the rightmost column of sub-pixels located in the display region AA.

In some embodiments of the present disclosure, an orthographic projection of the display region AA on the base substrate 10 may be in a shape of a rounded rectangle. For ease of description, four rounded corners of the rounded rectangle may be respectively referred to as a first rounded corner portion 10A, a second rounded corner portion 10B, a third rounded corner portion 10C and a fourth rounded corner portion 10D. For example, the first rounded corner portion 10A may be located at an upper left corner in FIG. 1, the second rounded corner portion 10B may be located at an upper right corner in FIG. 1, the third rounded corner portion 10C may be located at a lower left corner in FIG. 1, and the fourth rounded corner portion 10D may be located at a lower right corner in FIG. 1.

The test circuit 200 may be located on a side adjacent to the first boundary AA1 in the peripheral region NA. The test circuit 200 and the first boundary AA1, and the first rounded corner portion 10A and the second rounded corner portion 10B are arranged oppositely.

For example, the test circuit 200 may include a plurality of test pins, and the plurality of test pins may be used to provide a test signal. For example, the test signal may include a data signal for the plurality of pixel units P in the display region AA.

The multiplexer 400 may be located on a side adjacent to the second boundary AA2 in the peripheral region NA. The multiplexer 400 and the second boundary AA2, and the third rounded corner portion 10C and the fourth rounded corner portion 10D are arranged oppositely.

For example, the multiplexer 400 may perform a time-sharing multiplexing on signal lines in a wiring region. As shown in FIG. 1, the display panel includes an integrated circuit IC arranged in the peripheral region NA and a wiring region 500 between the integrated circuit IC and the multiplexer 400. Each signal output by the integrated circuit IC is transmitted to the multiplexer 400 through signal lines in the wiring region 500. Then, under a control of a signal control terminal of the multiplexer 400, each signal is output to each pixel unit P in the display region AA. By providing the multiplexer 400, the number of the signal lines arranged in the wiring region may be reduced, thereby reducing a wiring pressure in the wiring region.

The scan drive circuit 300 may be located on a side adjacent to the third boundary AA3 in the peripheral region NA and located on a side adjacent to the fourth boundary AA4 in the peripheral region NA. It should be noted that although FIG. 1 shows that the scan drive circuit is located on the left side and the right side of the display region AA, embodiments of the present disclosure is not limited to this. That is, the scan drive circuit may be located at any suitable position in the peripheral region NA.

For example, the scan drive circuit 300 may include at least one of a gate scan drive circuit, a light-emitting control scan drive circuit and a reset signal scan drive circuit. For example, the gate scan drive circuit, the light-emitting control scan drive circuit and the reset signal scan drive circuit may use the GOA technology, that is, the scan drive circuit 300 may include at least one of Gate GOA, EM GOA and RST GOA. In the GOA technology, the gate scan drive circuit, the light-emitting control scan drive circuit and the reset signal scan drive circuit are directly arranged on an array substrate to replace an external drive chip. Each GOA unit acts as a level of shift register, and each level of shift register is electrically connected to a gate line, a light-emitting control line or a reset signal line. A turn-on voltage is sequentially output in turn through each level of shift register, so as to realize a progressive scanning of pixels. In some embodiments, each level of shift register may further be connected to a plurality of gate lines, a plurality of light-emitting control lines, or a plurality of reset signal lines. In this way, it may adapt to a development trend of high resolution and narrow bezel of the display panel.

The display panel may include a plurality of load compensation units 100. As shown in FIG. 1 and FIG. 2, some of the plurality of load compensation units 100 are located at a position adjacent to the first rounded corner portion 10A in the peripheral region NA, and some others of the plurality of load compensation units 100 are located at a position adjacent to the second rounded corner portion 10B in the peripheral region NA. The plurality of load compensation units 100 are located between the test circuit 200 and the display region AA.

In embodiments of the present disclosure, each sub-pixel SP1, SP2 or SP3 may include a light-emitting element and a pixel drive circuit used to drive the light-emitting element. For example, the light-emitting device may include a first electrode, a second electrode and a light-emitting material layer located between the first electrode and the second electrode. The pixel drive circuit may include elements such as a transistor, a capacitance, etc. The pixel drive circuit receives a signal of a signal line provided on the display panel, generates a current used to drive the light-emitting device, and realizes a purpose of driving the light-emitting device to emit light by connecting the pixel drive circuit with one of the first electrode and the second electrode. For example, the pixel drive circuit is arranged on the base substrate, and the light-emitting device is located on a side of the pixel drive circuit away from the base substrate. For example, the pixel drive circuit may include a circuit structure such as 3T1C, 3T2C, 7T1C, 7T2C, 8T2C or 4T1C, etc., which is common in the art. For example, the light-emitting element may be an Organic Light-Emitting Diode (OLED) or a Quantum Dot Light-Emitting Diode (QLED).

Figure 14:
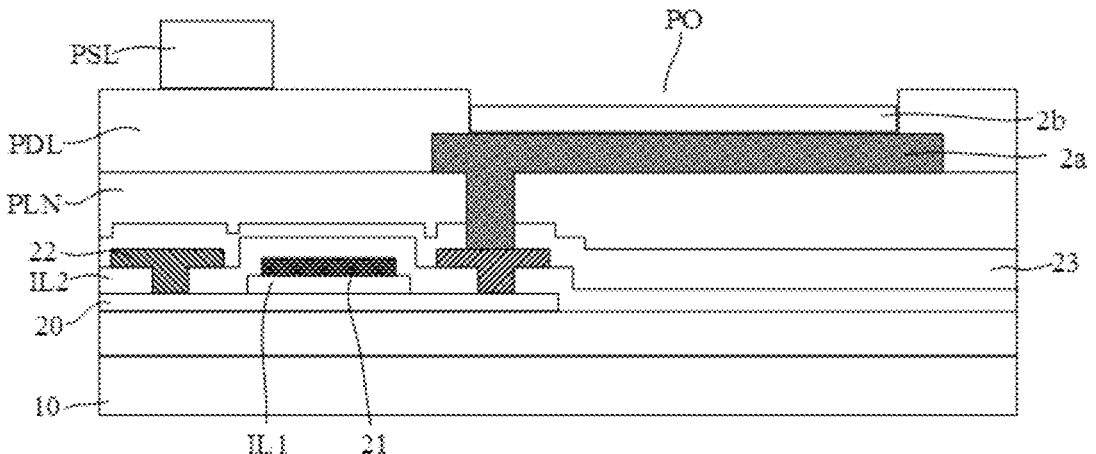
FIG. 14 is a schematic cross-sectional view of a display substrate according to some exemplary embodiments of the present disclosure, for example, a cross-sectional view taken along line AA' in FIG. 2.
Figure 15:
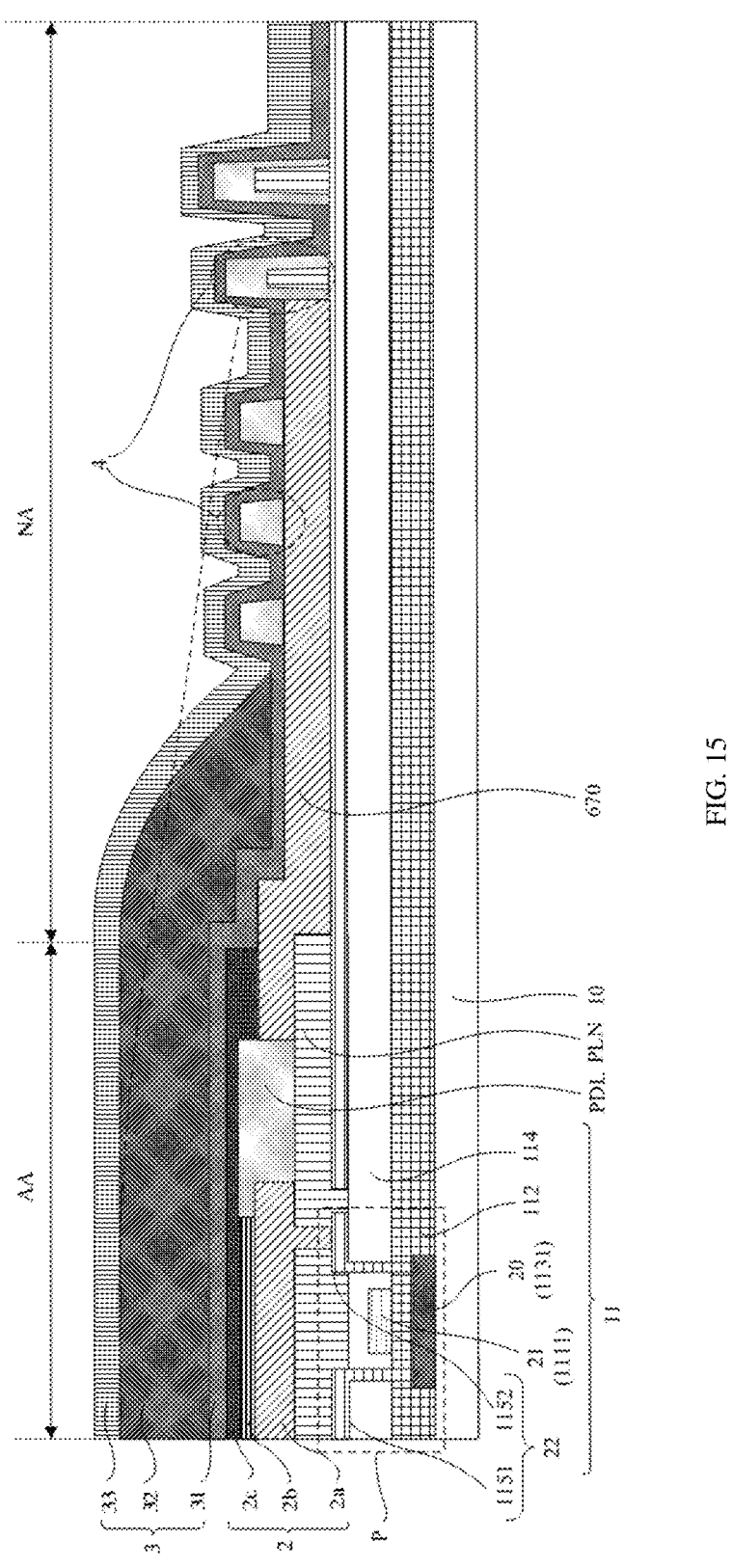
FIG. 15 is a schematic cross-sectional view of a display substrate according to some exemplary embodiments of the present disclosure, for example, a cross-sectional view taken along line BB' in FIG. 2.

FIG. 14 is a schematic cross-sectional view of a display substrate according to some exemplary embodiments of the present disclosure, for example, FIG. 14 may be a cross-sectional view taken along line AA' in FIG. 2; FIG. 15 is a schematic cross-sectional view of a display substrate according to some exemplary embodiments of the present disclosure, for example, FIG. 15 may be a cross-sectional view taken along line BB' in FIG. 2. Referring to FIG. 1, FIG. 2, FIG. 14 and FIG. 15 in combination, the display substrate may include a pixel drive circuit layer 11, a planarization layer PLN and a pixel defining layer PDL stacked in sequence on the base substrate 10.

The above-mentioned base substrate 10 includes a variety of structures, which may be selected according to actual needs. For example, the base substrate 10 may be a rigid substrate. For example, the rigid substrate may be a glass substrate or a PMMA (Polymethyl methacrylate) substrate. In this case, the above-mentioned display substrate may be a rigid display substrate. For another example, the base substrate 10 may be a flexible substrate. For example, the flexible substrate may be a PET (Polyethylene terephthalate) substrate, a PEN (Polyethylene naphthalate two formic acid glycol ester) substrate or a PI (Polyimide) substrate. In this case, the above-mentioned display substrate may be a flexible display substrate.

For example, as shown in FIG. 15, the pixel drive circuit layer 11 may include a semiconductor layer 20, a gate insulation layer IL1, a first conductive layer 21, an interlayer insulation layer IL2, and a second conductive layer 22 stacked in sequence.

For example, as shown in FIG. 15, the first conductive layer 21 includes a plurality of gate electrodes 1111, the semiconductor layer 20 includes a plurality of active patterns 1131, and the second conductive layer 22 includes a plurality of source electrodes 1151 and a plurality of drain electrodes 1152. For example, an active pattern 1131, a gate electrode 1111, a source electrode 1151 and a drain electrode 1152 that are corresponded may form a transistor. For example, a plurality of transistors may form a pixel drive circuit P. The pixel drive circuit layer 11 may include a plurality of pixel drive circuits P. As shown in FIG. 15, a transistor is used in the present disclosure to schematically represent a pixel drive circuit P.

In some examples, as shown in FIG. 15, the display substrate further includes: a plurality of light-emitting devices 2 located on a side of the planarization layer PLN away from the base substrate 10 in the display region AA. For example, the light-emitting device 2 may be an OLED.

Exemplarily, the light-emitting device 2 includes an anode 2*a*, a light-emitting layer 2*b* and a cathode 2*c* stacked in sequence.

For example, the anode 2*a* of the light-emitting device 2 is arranged on a side surface of the planarization layer PLN away from the base substrate 10. The anode 2*a* of the light-emitting device 2 may be electrically connected to the pixel drive circuit P by penetrating the planarization layer PLN.

For example, a structure of the anode 2*a* may be a composite structure formed by sequentially stacking a transparent conductive oxide thin film, a metal thin film, and a transparent conductive oxide thin film. For example, a material of the above-mentioned transparent conductive oxide thin film is any one of Indium tin oxide (ITO) and Indium zinc oxide (IZO), and a material of the above-mentioned metal thin film is any one of gold (Au), silver (Ag), nickel (Ni) and platinum (Pt).

For another example, the structure of anode 2*a* may further be a single-layer structure, and a material of the single-layer structure may be any one of ITO, IZO, Au, Ag, Ni and Pt.

Exemplarily, the above-mentioned pixel defining layer PDL includes a plurality of openings PO. An opening exposes a part of an anode 2*a*. At least a part of a light-emitting layer 2*b* is located in an opening and electrically connected a corresponding anode 2*a*. That is, each light-emitting layer 2*b* is electrically connected to the corresponding anode 2*a* through a part or an entirety of the light-emitting layer 2*b* located in the corresponding opening.

Here, an arrangement of the light-emitting layer 2*b* is related to a preparation process of the light-emitting layer 2*b*. For example, in a case that the light-emitting layer 2*b* is formed by an evaporation process, a part of the light-emitting layer 2*b* may be located in the corresponding opening, and the other part of the light-emitting layer 2*b* may be overlapped on the pixel defining layer PDL around the opening. In a case that the light-emitting layer 2*b* is formed by an inkjet printing technology, the light-emitting layer 2*b* is completely located in the corresponding opening.

Exemplarily, as shown in FIG. 15, the cathode 2*c* is located on a side of the pixel defining layer PDL away from the base substrate 10. The cathodes 2*c* of each light-emitting device may be electrically connected to each other to form an integrated structure.

For example, a material of the cathode 2*c* may be any one of aluminum (Al), silver (Ag) and magnesium (Mg), or any one of magnesium silver alloy and aluminum lithium alloy.

For example, the light-emitting device 2 may further include at least one of a hole injection layer, a hole transport layer and an electron barrier layer that is arranged between the anode 2*a* and the light-emitting layer 2*b*, and at least one of an electron injection layer, an electron transport layer and a hole barrier layer that is arranged between the cathode 2*c* and the light-emitting layer 2*b*. A light-emitting efficiency of the light-emitting device 2 may be improved by providing at least one of the hole injection layer, the hole transport layer and the electron barrier layer between the anode 2*a* and the light-emitting layer 2*b* of the light-emitting device 2, and providing at least one of the electron injection layer, the electron transport layer and the hole barrier layer between the cathode 2*c* and the light-emitting layer 2*b* of the light-emitting device 2. In embodiments of the present disclosure, at least one of the light-emitting layer, the hole injection layer, the hole transport layer and the electron barrier layer may be represented by an expression "functional layer".

In some examples, as shown in FIG. 15, the display substrate further includes: an encapsulation layer 3 arranged on a side of the light-emitting device 2 away from the base substrate 10. On this basis, the above-mentioned plurality of light-emitting devices 2 are located between the base substrate 10 and the encapsulation layer 3.

Exemplarily, as shown in FIG. 15, the encapsulation layer 3 includes a first inorganic layer 31, an organic layer 32 and a second inorganic layer 33 stacked in sequence.

The first inorganic layer 31 and the second inorganic layer 33 mainly serves to block water and/or oxygen from intruding the light-emitting device 2, and the organic layer 32 serves to assist an encapsulation and a planarization. That is, the more flat a side surface of the organic layer 32 away from the base substrate 10, the more flat a side surface of the encapsulation layer 3 away from the base substrate 10.

Exemplarily, the first inorganic layer 31 and the second inorganic layer 33 may be made of inorganic materials such as nitride, oxide, nitrogen oxide, nitrate and carbide or any combination thereof. The organic layer 32 may be made of materials such as acrylic fiber, hexamethyldisiloxane, poly-acrylate, polycarbonate, polystyrene, etc.

In some examples, as shown in FIG. 15, the display substrate further includes: at least one barrier dam 4 located on a side of the base substrate 10 in the peripheral region NA. The at least one barrier dam 4 is located on a side of the peripheral region NA away from the display region AA, that is, the at least one barrier dam 4 is located on a side of the peripheral region NA close to the outside.

It should be noted that the above-mentioned encapsulation layer 3 is located on a side of the barrier dam 4 away from the base substrate 10.

In embodiments of the present disclosure, the number of the barrier dams 4 is not limited, which may be selected according to actual needs.

In some examples, an orthographic projection of the organic layer 32 on the base substrate 10 is located on a side of an orthographic projection of the at least one barrier dam 4 on the base substrate 10 close to the display region AA. That is, the organic layer 32 is located in a region surrounded by the at least one barrier dam 4.

Exemplarily, in a case that a plurality of barrier dams 4 are provided, the orthographic projection of the organic layer 32 on the base substrate 10 is located on a side of an orthographic projection of one of the barrier dams 4 on the base substrate 10 close to the display region AA.

It should be noted that in embodiments of the present disclosure, the barrier dam 4 may be used to block a flow, in a direction from the display region AA to the peripheral region NA, of an organic solution used to form the organic layer 32.

When preparing the organic layer 32, the organic solution may stop leveling before the at least one barrier dam 4, so that a side surface of the prepared organic layer 32 has a higher slope. The side surface of the organic layer 32 away from the base substrate 10 is closer to a surface parallel to the base substrate 10, that is, the side surface of the organic layer 32 is more flat, thereby the side surface of the encapsulation layer 3 away from the base substrate 10 is more flat.

Furthermore, since the orthographic projection of the organic layer 32 on the base substrate 10 is located on the side of the orthographic projection of the at least one barrier dam 4 on the base substrate 10 close to the display region AA, and the orthographic projection of the at least one barrier dam 4 on the base substrate 10 is located within a range of an orthographic projection of the second inorganic layer 33 on the base substrate 10, it may be ensured that the orthographic projection of the organic layer 32 on the base substrate 10 is located within the range of the orthographic projection of the second inorganic layer 33 on the base substrate 10. That is, it may be ensured that the second inorganic layer 33 completely covers the organic layer 32 to prevent water and/or oxygen from entering into an interior of the display substrate through the organic layer 32 so as to corrode the light-emitting device 2, thereby an encapsulation effect of the encapsulation layer 3 may be ensured and an encapsulation failure may be avoided.

Referring to FIG. 14 and FIG. 15, in embodiments of the present disclosure, the light-emitting layers 2b of the light-emitting devices of each sub-pixel are formed by using the evaporation process.

The inventors found through research that a Fine Metal Mask (FMM for short) is required in the evaporation process. In this case, a Photo Spacer (PS for short) is required to be fabricated on the pixel defining layer PDL to prevent a direct contact between the Fine Metal Mask (FMM for short) and a pixel structure during an evaporation process of an OLED organic light-emitting material, resulting in a scratch of the pixel structure and a generation of defects. In an actual production process, for some OLED display products, the FMM is designed to have a large through-hole, a sag of which is large under an influence of gravity, and a possibility of a large-area contact between the FMM and the display panel may be increased. In this case, in addition to a contact with the display region, the FMM may further be in contact with the peripheral region NA (i.e., a bezel region) of the display panel, which may result in other undesirable problems, such as a scratch of a GOA drive circuit provided in the peripheral region NA, a generation of electrostatic discharge (i.e., ESD) caused by a contact with a circuit, etc. to this end, in embodiments of the present disclosure, a photo spacer layer PSL is prepared on the pixel defining layer PDL.

As shown in FIG. 14, the display panel may include: the base substrate 10; the semiconductor layer 20 arranged on the base substrate 10; the first conductive layer 21 arranged on a side of the semiconductor layer 20 away from the base substrate 10; the second conductive layer 22 arranged on a side of the first conductive layer 21 away from the base substrate 10; an interlayer insulating layer 23 arranged on a side of the second conductive layer 22 away from the base substrate 10; a third conductive layer 24 arranged on a side of the interlayer insulating layer 23 away from the base substrate 10; the planarization layer PLN arranged on a side of the third conductive layer 24 away from the base substrate 10; the first electrode layer (for example, the anode 2a is located in the first electrode layer) arranged on a side of the planarization layer PLN away from the base substrate 10; the pixel defining layer PDL arranged on a side of the first electrode layer away from the base substrate 10; and the photo spacer layer PSL arranged on a side of the pixel defining layer PDL away from the base substrate 10.

It should be noted that the display panel according to embodiments of the present disclosure is not limited to the above-mentioned film layers, and one or more layers of insulating layers may further be provided between the conductive layers. For example, a first insulating layer IL1 may be provided between the semiconductor layer 20 and the first conductive layer 21, and a second insulating layer IL2 may be provided between the first conductive layer 21 and the second conductive layer 22. The planarization layer PLN may include a planarization layer or a plurality of planarization sub-layers.

Figure 3:
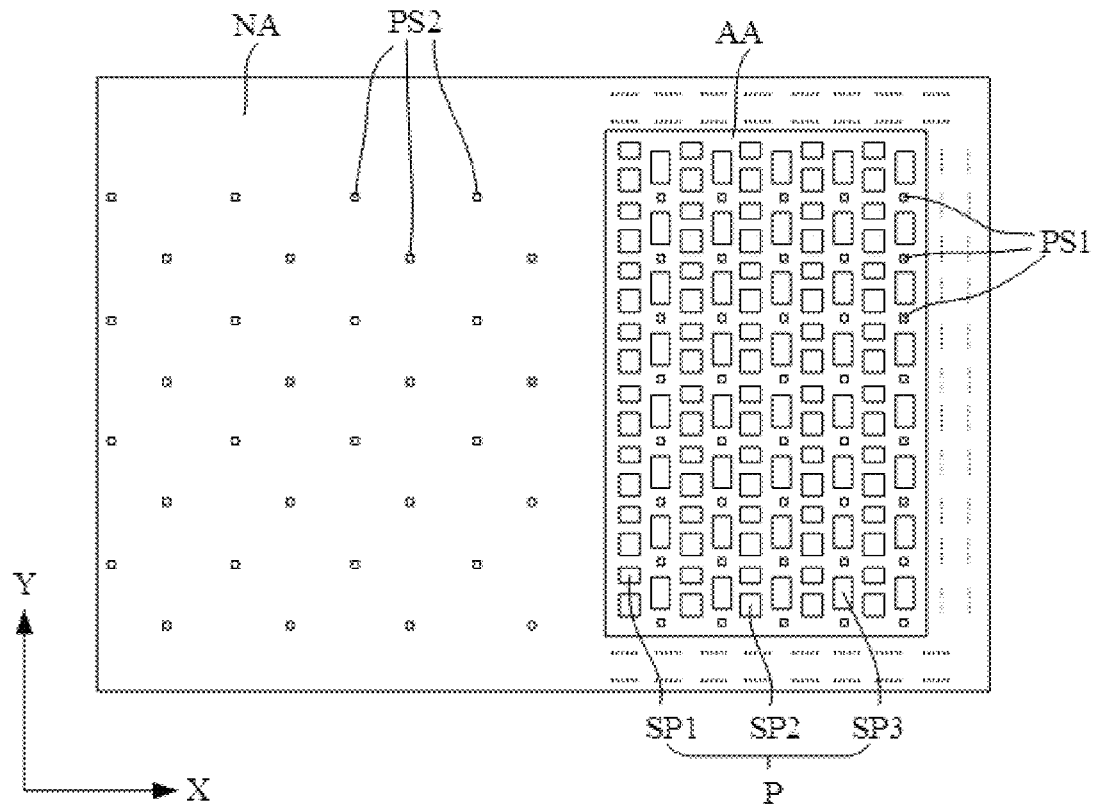
FIG. 3 is a schematic plan view of a display panel according to some exemplary embodiments of the present disclosure, which schematically shows a display region, a peripheral region and a plurality of photo spacers.
Figure 4:
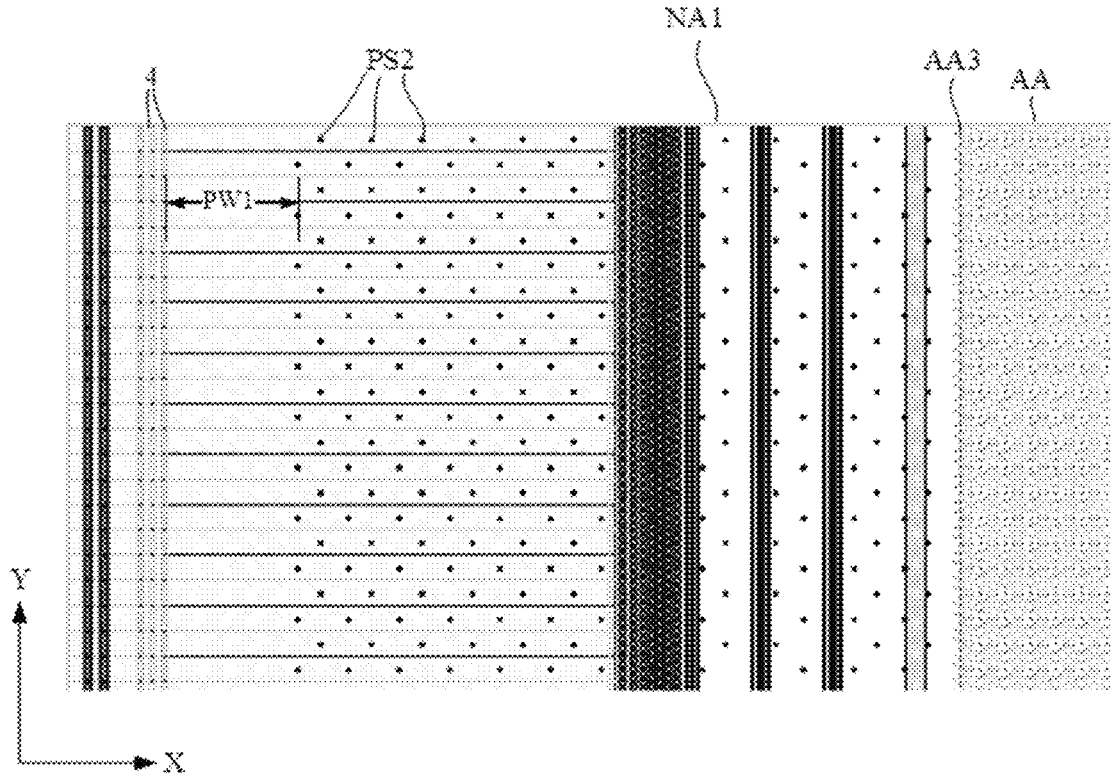
FIG. 4 is a partial enlarged view of a portion I in FIG. 1 of the display panel according to some exemplary embodiments of the present disclosure.
Figure 5:
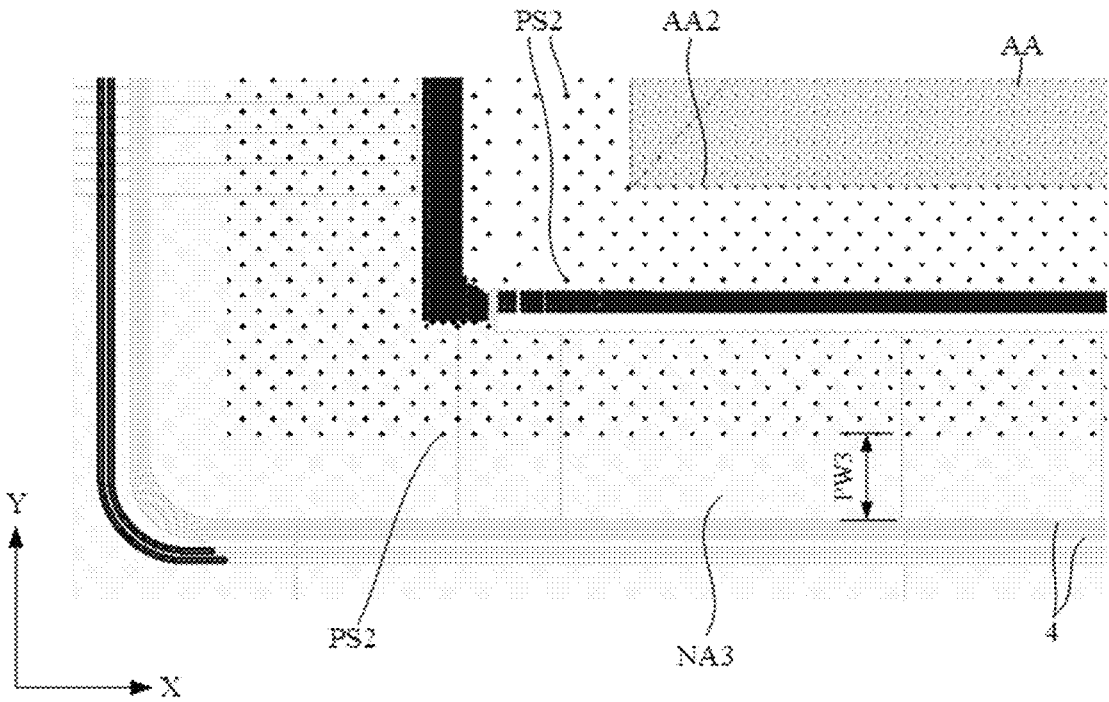
FIG. 5 is a partial enlarged view of a portion II in FIG. 1 of the display panel according to some exemplary embodiments of the present disclosure.
Figure 6:
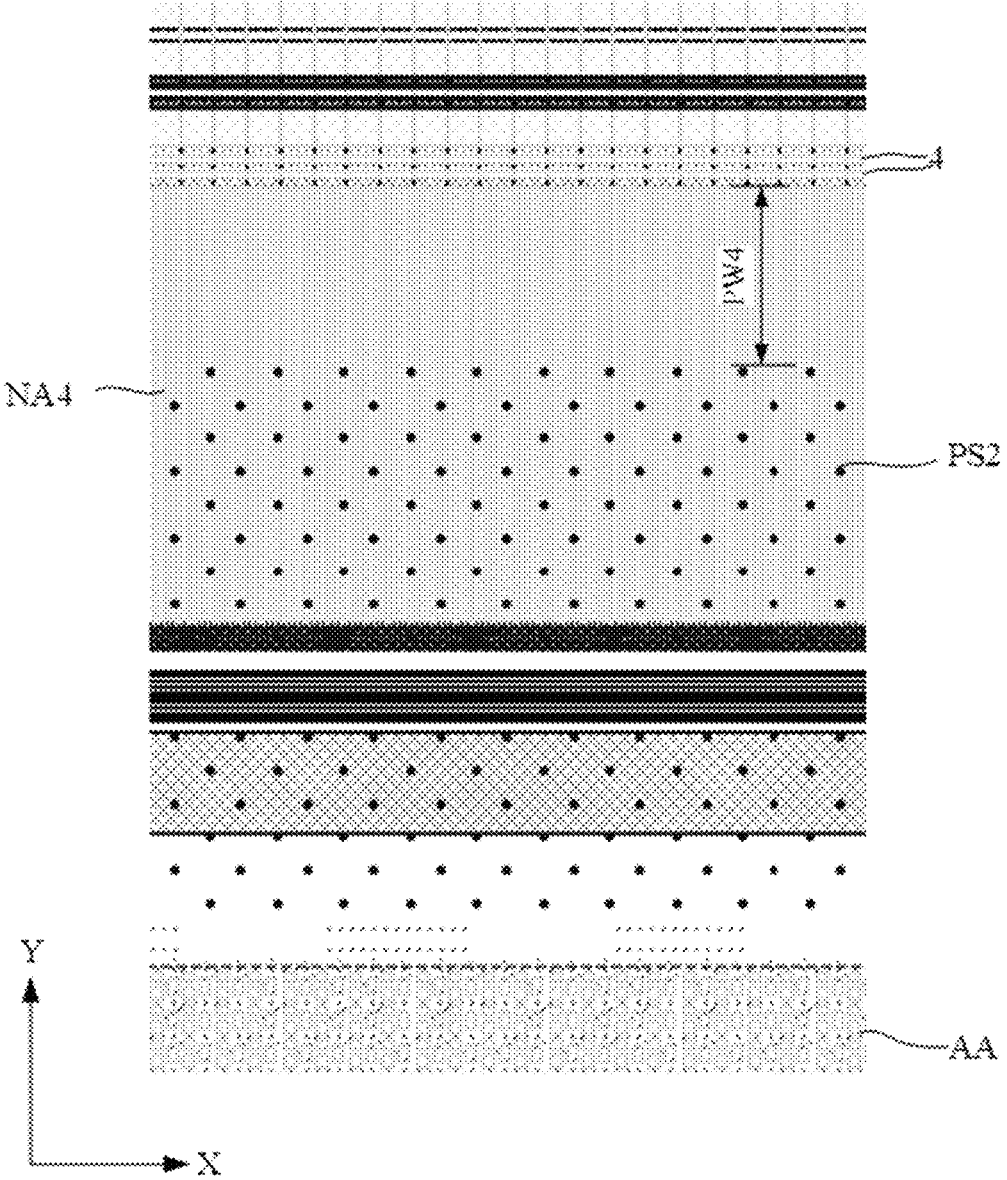
FIG. 6 is a partial enlarged view of a portion III in FIG. 1 of the display panel according to some exemplary embodiments of the present disclosure.
Figure 7:
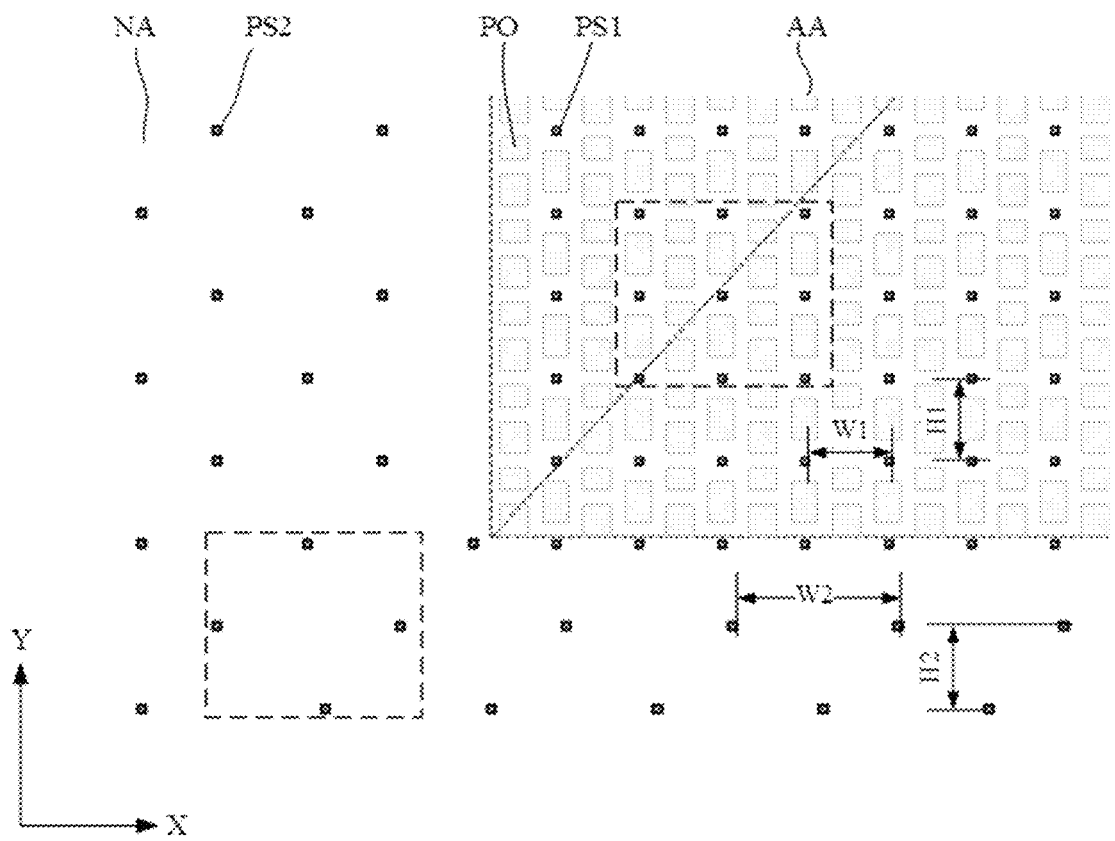
FIG. 7 is a partial enlarged view of a display panel according to some exemplary embodiments of the present disclosure, which schematically shows a distribution density of a first photo spacer and a distribution density of a second photo spacer.
Figure 8:
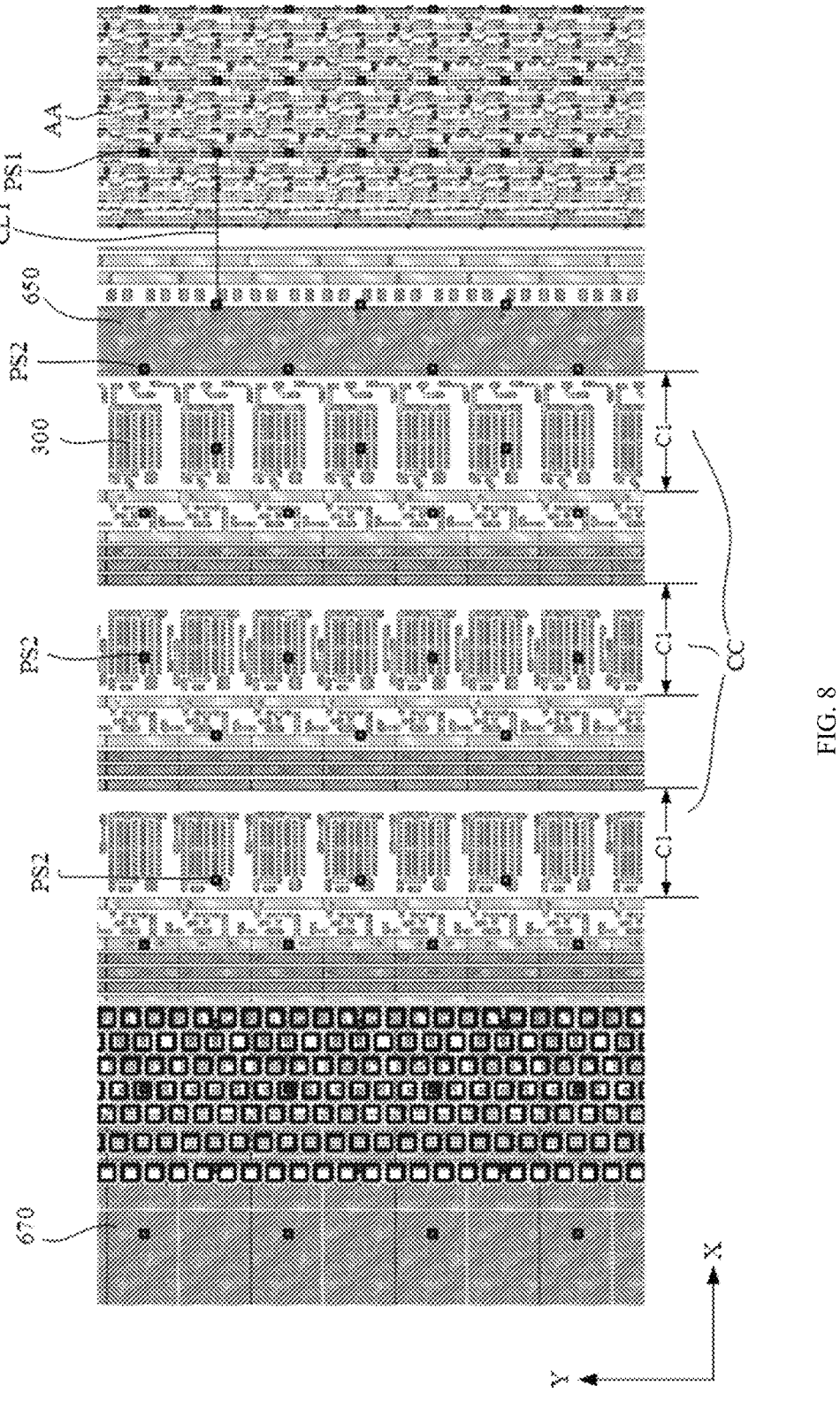
FIG. 8 is a partial enlarged view of a portion I in FIG. 1 of the display panel according to some exemplary embodiments of the present disclosure, which schematically shows a part of sub-pixels, a scan drive circuit region, a first photo spacer, and a second photo spacer.
Figure 9:
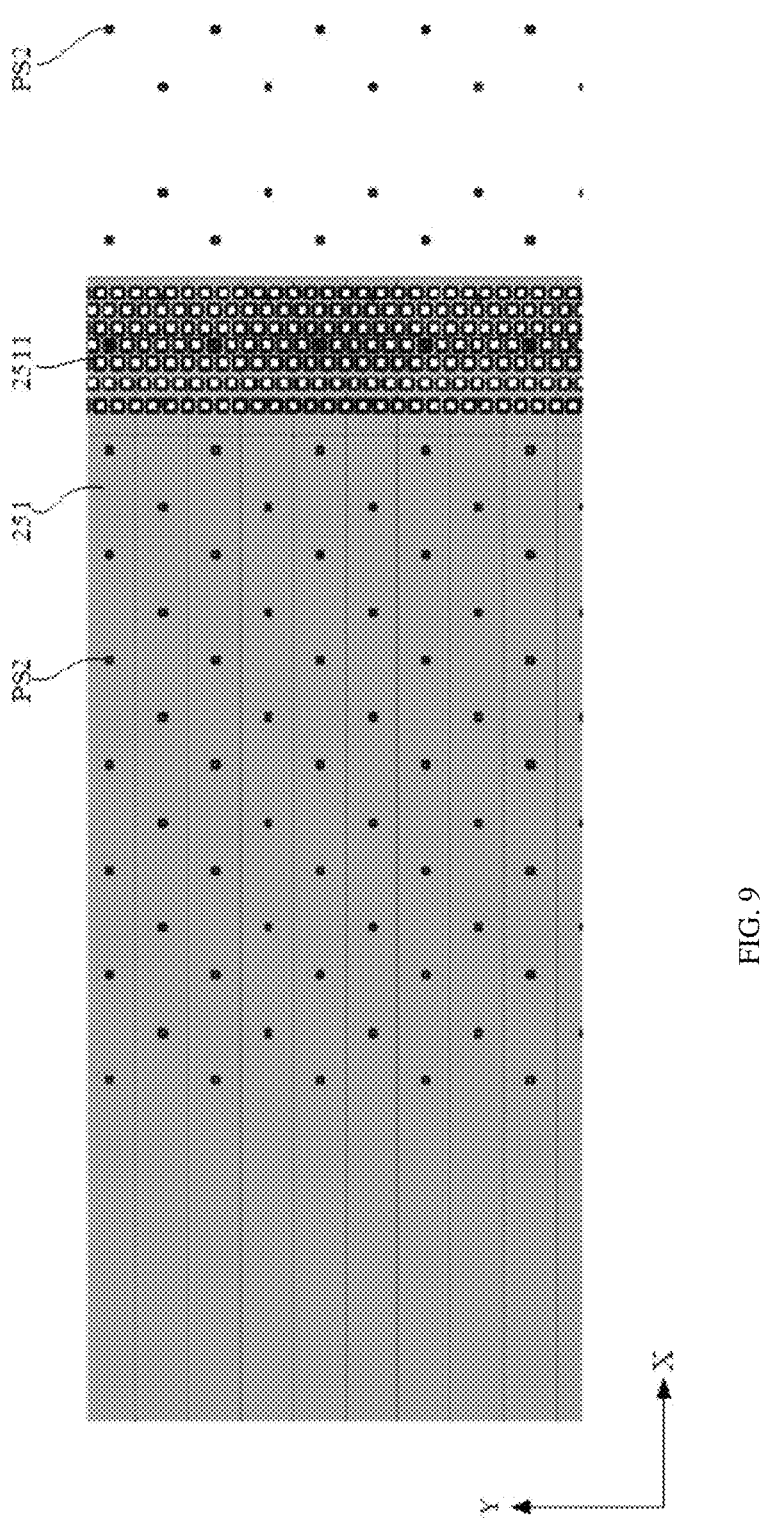
FIG. 9 is a partial enlarged view of a portion I in FIG. 1 of the display panel according to some exemplary embodiments of the present disclosure, which schematically shows a first electrode layer, a first photo spacer, and a second photo spacer.
Figure 10:
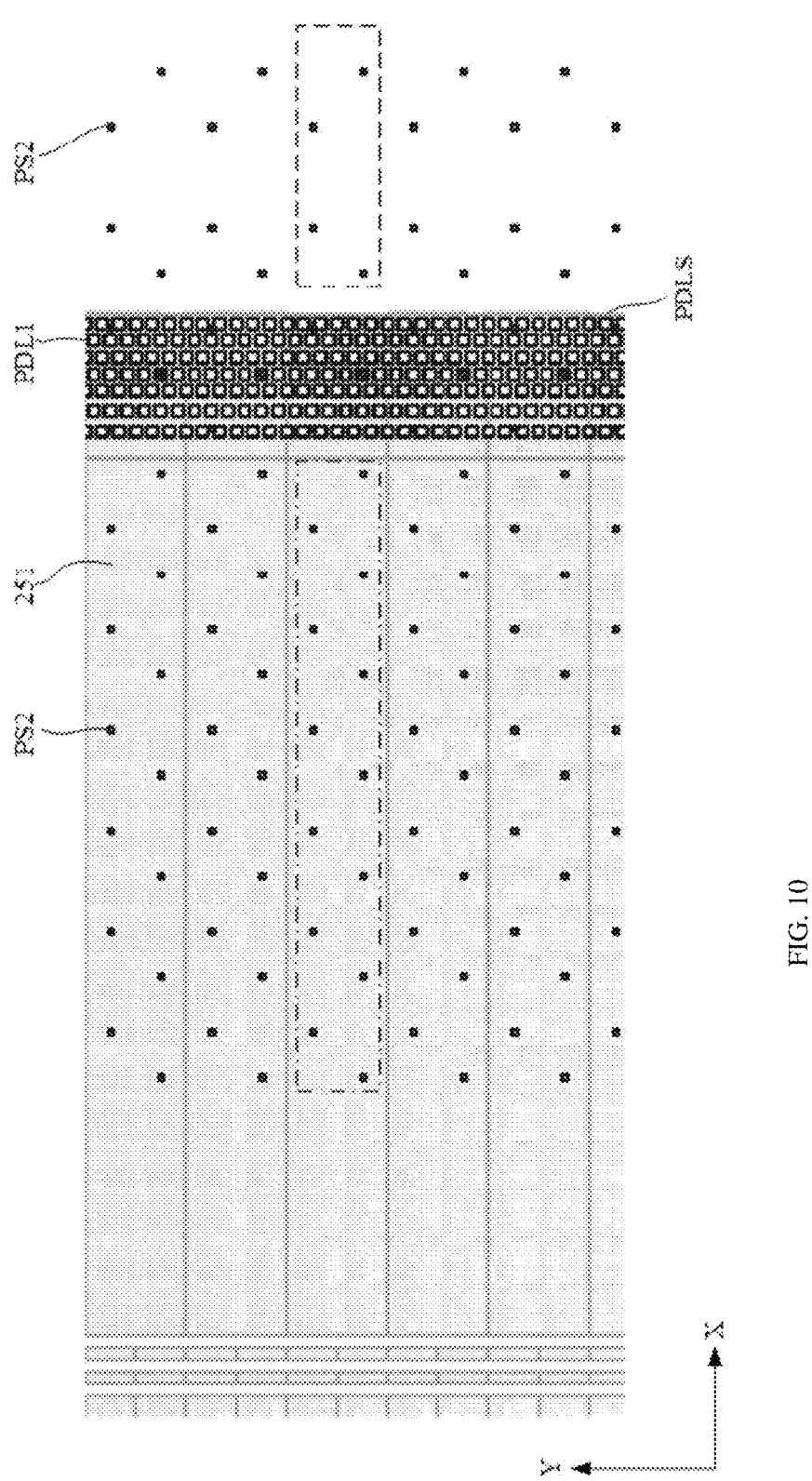
FIG. 10 is a partial enlarged view of a portion I in FIG. 1 of the display panel according to some exemplary embodiments of the present disclosure, which schematically shows a pixel defining layer, a first photo spacer, and a second photo spacer.
Figure 11:
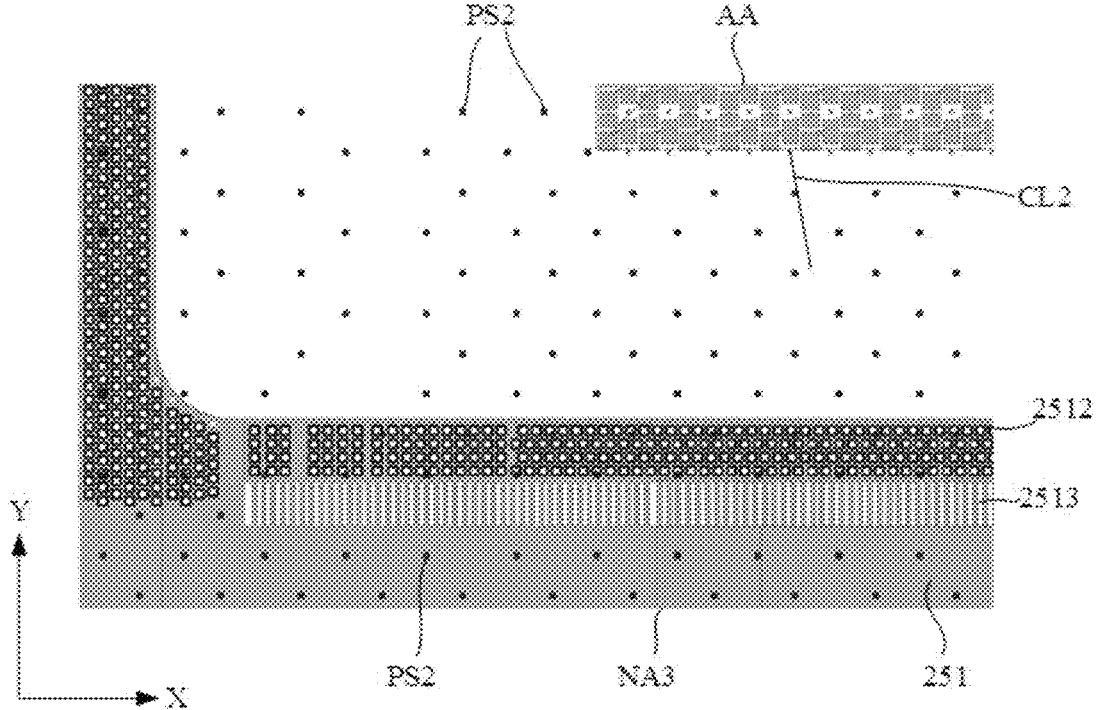
FIG. 11 is a partial enlarged view of a portion II in FIG. 1 of the display panel according to some exemplary embodiments of the present disclosure, which schematically shows a first electrode layer, a first photo spacer, and a second photo spacer.
Figure 12:
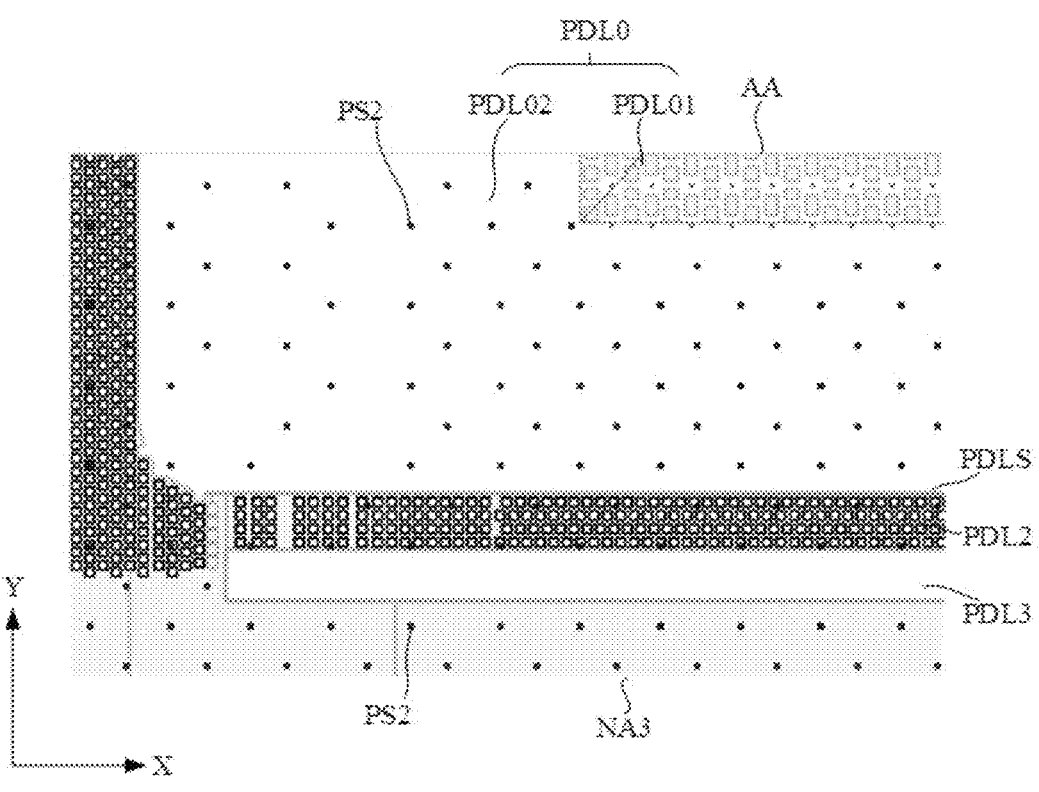
FIG. 12 is a partial enlarged view of a portion II in FIG. 1 of the display panel according to some exemplary embodiments of the present disclosure, which schematically shows a pixel defining layer, a first photo spacer, and a second photo spacer.
Figure 13:
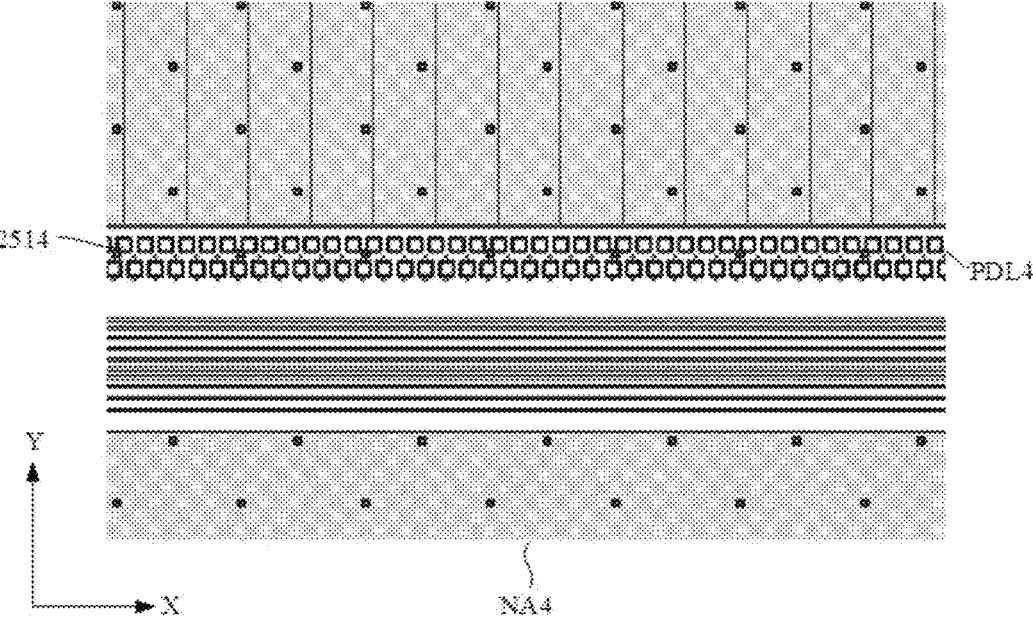
FIG. 13 is a partial enlarged view of a portion III in FIG. 1 of the display panel according to some exemplary embodiments of the present disclosure, which schematically shows a pixel defining layer, a first photo spacer and a second photo spacer.

FIG. 3 is a schematic plan view of a display panel according to some exemplary embodiments of the present disclosure, which schematically shows a display region, a peripheral region and a plurality of photo spacers. FIG. 4 is a partial enlarged view of a portion I in FIG. 1 of the display panel according to some exemplary embodiments of the present disclosure. FIG. 5 is a partial enlarged view of a portion II in FIG. 1 of the display panel according to some exemplary embodiments of the present disclosure. FIG. 6 is a partial enlarged view of a portion III in FIG. 1 of the display panel according to some exemplary embodiments of the present disclosure. FIG. 7 is a partial enlarged view of a display panel according to some exemplary embodiments of the present disclosure, which schematically shows a distribution density of a first photo spacer and a distribution density of a second photo spacer. FIG. 8 is a partial enlarged view of a portion I in FIG. 1 of the display panel according to some exemplary embodiments of the present disclosure, which schematically shows a part of sub-pixels, a scan drive circuit region, a first photo spacer, and a second photo spacer. FIG. 9 is a partial enlarged view of a portion I in FIG. 1 of the display panel according to some exemplary embodiments of the present disclosure, which schematically shows a first electrode layer, a first photo spacer, and a second photo spacer. FIG. 10 is a partial enlarged view of a portion I in FIG. 1 of the display panel according to some exemplary embodiments of the present disclosure, which schematically shows a pixel defining layer, a first photo spacer, and a second photo spacer. FIG. 11 is a partial enlarged view of a portion II in FIG. 1 of the display panel according to some exemplary embodiments of the present disclosure, which schematically shows a first electrode layer, a first photo spacer, and a second photo spacer. FIG. 12 is a partial enlarged view of a portion II in FIG. 1 of the display panel according to some exemplary embodiments of the present disclosure, which schematically shows a pixel defining layer, a first photo spacer, and a second photo spacer. FIG. 13 is a partial enlarged view of a portion III in FIG. 1 of the display panel according to some exemplary embodiments of the present disclosure, which schematically shows a pixel defining layer, a first photo spacer and a second photo spacer.

It should be noted that in the accompanying drawings of the present disclosure, for the insulating layers such as the planarization layer, the pixel defining layer, etc., a white part represents a part of the insulating layers including a material, and a filled part represents a part of the insulating layers without a material.

Referring to FIG. 3 to FIG. 14 in combination, the photo spacer layer PSL may include a plurality of first photo spacers PS1 located in the display region AA and a plurality of second photo spacers PS2 located in the peripheral region NA.

As shown in FIG. 3, the plurality of first photo spacer PS1 are arranged in an array in the display region AA, the plurality of second photo spacer PS2 are arranged in an array in the peripheral region NA, and the plurality of second photo spacer PS2 are located between the outer boundary and the at least one barrier dam 4.

As shown in FIG. 3 and FIG. 7, in embodiments of the present disclosure, a distribution density of the plurality of second photo spacers PS2 in the peripheral region NA is less than a distribution density of the plurality of first photo spacers PS1 in the display region AA.

In some embodiments of the present disclosure, the distribution density of the plurality of second photo spacers PS2 in the peripheral region NA is ¼ to ⅔ of the distribution density of the plurality of first photo spacers PS1 in the display region AA. For example, in the embodiment shown in FIG. 7, four second photo spacers PS2 are provided in an unit area (as shown in a rectangular box in FIG. 7) of the peripheral region NA, and nine first photo spacers PS1 are provided in an unit area (as shown in the other rectangular box in FIG. 7) of the display region AA. That is, the distribution density of the plurality of second photo spacers PS2 in the peripheral region NA is 4⁄9 of the distribution density of the plurality of first photo spacers PS1 in the display region AA. For example, in some embodiments of the present disclosure, the distribution density of the plurality of second photo spacers PS2 in the peripheral region NA is about ½ of the distribution density of the plurality of first photo spacers PS1 in the display region AA.

In embodiments of the present disclosure, on one hand, a design of photo spacers is added in the peripheral region NA of the display panel, that is, the second photo spacers PS2 are added in the peripheral region NA, which may avoid a contact between the FMM and the peripheral region of the display panel, so as to avoid the problems, such as a scratch of a GOA drive circuit provided in the peripheral region, a generation of electrostatic discharge (i.e., ESD) caused by a contact with a circuit, etc. On the other hand, in consideration of a risk that the FMM may scratch the photo spacer in an actual production process so as to produce photo spacer particles, in embodiments of the present disclosure, the distribution density of the photo spacers PS2 in the peripheral region NA is less than the distribution density of the photo spacers PS1 in the display region AA, which may reduce a probability of a scratch between the FMM and the photo spacers, thereby reducing a risk of producing many particles of the photo spacers.

Specifically, referring to FIG. 7, two first photo spacers PS1 adjacent to each other in the first direction X are spaced by a first distance W1 in the first direction, two second photo spacers PS2 adjacent to each other in the first direction X are spaced by a second distance W2 in the first direction, and the first distance W1 is less than the second distance W2.

Alternatively or additionally, two first photo spacers PS1 adjacent to each other in the second direction Y are spaced by a third distance H1 in the second direction, two second photo spacers PS2 adjacent to each other in the second direction Y are spaced by a fourth distance H2 in the second direction, and the third distance H1 is less than the fourth distance H2.

Referring to FIG. 4, FIG. 5 and FIG. 6, an outermost row of second photo spacers PS2 are spaced from the at least one barrier dam 4.

In embodiments of the present disclosure, the peripheral region NA may include a first side peripheral region NA1, a second side peripheral region NA2, a third side peripheral region NA3, and a fourth side peripheral region NA4. For example, the first side peripheral region NA1 and the second side peripheral region NA2 are located on two sides of the display region AA in the first direction X, respectively. That is, the first side peripheral region NA1 and the second side peripheral region NA2 are a left side peripheral region and a right side peripheral region in FIG. 1, respectively. The third peripheral region NA3 and the fourth peripheral region NA4 are located on two sides of the display region AA in the second direction Y, respectively. That is, the third peripheral region NA3 and the fourth peripheral region NA4 are a lower side peripheral region and an upper side peripheral region in FIG. 1, respectively.

As shown in FIG. 4, in the first side peripheral region NA1, the outermost row of second photo spacers PS2 (i.e., a leftmost column of second photo spacers PS2) are spaced from the at least one barrier dam 4 by, for example, a spacing distance of PW1.

For example, a distribution of photo spacers in the second side peripheral region NA2 may be symmetrical with the distribution of the photo spacers in the first side peripheral region NA1. That is to say, in the second side peripheral region NA2, the outermost row of second photo spacers PS2 (i.e., a rightmost column of second photo spacers PS2) are spaced from the at least one barrier dam 4 by, for example, the spacing distance of PW1.

As shown in FIG. 5, in the third side peripheral region NA3, the outermost row of second photo spacers PS2 (i.e., a lowermost row of second photo spacers PS2) are spaced from the at least one barrier dam 4 by, for example, a spacing distance of PW3.

As shown in FIG. 6, in the fourth side peripheral region NA4, the outermost row of second photo spacers PS2 (i.e., an uppermost row of second photo spacers PS2) are spaced from the at least one barrier dam 4 by, for example, a spacing distance of PW4.

In embodiments of the present disclosure, in the first peripheral region NA1, the second peripheral region NA2, the third peripheral region NA3, and the fourth peripheral region NA4, spacing distances between orthographic projections of the outermost row of second photo spacers PS2 on the base substrate 10 and the orthographic projection of the at least one barrier dam 4 on the base substrate 10 is substantially equal to each other. In other words, the spacing distances PW1, PW3 and PW4 are substantially equal to each other.

It should be noted that an expression "substantially equal" used herein may mean that two objects being compared are strictly equal to each other, or the two objects being compared are approximately equal to each other. Specifically, here, the spacing distances PW1, PW3 and PW4 being substantially equal to each other may include that: a ratio between any two of the spacing distances PW1, PW3 and PW4 is in a range of 0.8 to 1.2.

For example, the spacing distances PW1, PW3, PW4 between the orthographic projections of the outermost row of second photo spacers on the base substrate and the orthographic projection of the at least one barrier dam on the base substrate may be in a range of 300 microns to 1000 microns, for example, about 600 microns.

Referring to FIG. 7 and FIG. 8, at least one row of second photo spacers PS2 located in at least one of the first side peripheral region NA1 and the second side peripheral region NA2 are substantially aligned with at least one row of first photo spacers PS1 located in the display region AA in the first direction X, respectively.

It should be noted that an expression "substantially aligned" used herein may mean that two objects being compared are strictly aligned with each other in at least one direction, or the two objects being compared are approximately aligned with each other in at least one direction. Specifically, here, the at least one row of second photo spacers PS2 being respectively substantially aligned with the at least one row of first photo spacers PS1 in the first direction X, may include that: in the first photo spacers PS1 and the second photo spacers PS2 that are located in a same row, a connecting line (e.g., a connecting line CL1 in FIG. 8) between the first photo spacer PS1 and the second photo spacer PS2 that are adjacent to each other is parallel to the first direction X, or an included angle between the connecting line CL1 and the first direction X is in a range of ±10°.

Referring to FIG. 7 and FIG. 11, at least one column of second photo spacers PS2 located in the third side peripheral region NA3 are substantially aligned with at least one column of first photo spacers PS1 located in the display region AA in the second direction Y, respectively.

It should be noted that the expression "substantially aligned" used herein may mean that the two objects being compared are strictly aligned with each other in at least one direction, or the two objects being compared are approximately aligned with each other in at least one direction. Specifically, here, the at least one row of second photo spacers PS2 being respectively substantially aligned with the at least one row of first photo spacers PS1 in the second direction Y may include that: in the first photo spacers PS1 and the second photo spacers PS2 that are located in the same column, a connecting line (e.g., a connecting line CL2 in FIG. 11) between the first photo spacer PS1 and the second photo spacer PS2 that are adjacent to each other is parallel to the second direction Y, or an included angle between the connecting line CL2 and the second direction Y is in a range of ±10°.

Referring to FIG. 8, the display panel further includes a drive voltage lead line 650 located in the peripheral region NA on the base substrate 10. The drive voltage lead line 650 is used to transmit a drive voltage. For example, the drive voltage lead line 650 may transmit a VDD voltage.

Continuing to refer to FIG. 8, the display panel further includes a scan drive circuit 300 located in at least one of the first side peripheral region NA1 and the second side peripheral region NA2 on the base substrate 10. The scan drive circuit 300 is used to output a scan signal.

The peripheral region NA includes a scan drive circuit region CC. The scan drive circuit region CC is located in at least one of the first side peripheral region NA1 and the second side peripheral region NA2. The scan drive circuit 300 is arranged in the scan circuit region CC. The scan drive circuit region CC is located between the drive voltage lead line 650 and the at least one barrier dam 4.

For example, in at least one of the first side peripheral region NA1 and the second side peripheral region NA2, the scan drive circuit region CC includes at least three GOA sub-regions C 1 distributed in sequence in the first direction X. For example, a GOA sub-region close to the display region AA in the above-mentioned three GOA sub-regions may include a gate GOA circuit (Gate GOA), a second GOA sub-region distributed in the first direction X may include a first reset GOA circuit (RST1 GOA), and a third GOA sub-region distributed in the first direction X may include a second reset GOA circuit (RST2 GOA) and a light-emitting control GOA circuit (EM GOA). Certainly, the GOA region CC of the above-mentioned display substrate may further include more GOA sub-regions, which may be determined according to an actual GOA circuit design.

As shown in FIG. 8, orthographic projections of some of the plurality of second photo spacers PS2 on the base substrate 10 at least partially overlap with an orthographic projection of the drive voltage lead line 650 on the base substrate 10.

Orthographic projections of some of the plurality of second photo spacers PS2 on the base substrate 10 at least partially overlap with an orthographic projection of the scan drive circuit region CC on the base substrate 10. In the embodiment, the second photo spacers PS2 are arranged in a region where the drive voltage lead line is located, which may prevent the FMM from scratching the drive voltage lead line and prevent the drive voltage lead line from generating defects.

For example, the orthographic projections of some of the plurality of second photo spacers PS2 on the base substrate 10 at least partially overlap with an orthographic projection of each of the plurality of scan drive circuit regions Cl on the base substrate 10. In the embodiment, the second photo spacers PS2 are arranged in a region where the scan drive circuit is located, which may prevent the FMM from scratching the scan drive circuit and prevent the scan drive circuit from generating defects.

The display panel further includes a first voltage lead line 670 and an auxiliary conductive portion 251. The first voltage lead line 670 is used to provide a first voltage, for example, a VSS voltage. The auxiliary conductive portion 251 is located in a same layer as the first electrode (e.g., the anode 2a) of the light-emitting device. A part of the auxiliary conductive portion 251 is in direct contact with the first voltage lead line 670 so as to form an electrical connection therebetween. That is to say, in embodiments of the present disclosure, the first voltage lead line 670 and the auxiliary conductive portion 251 located in different conductive layers are connected in parallel, both of which are used to transmit the first voltage VSS. In this way, a resistance of a signal line transmitting the first voltage VSS may be reduced.

Orthographic projections of some of the plurality of second photo spacers PS2 on the base substrate 10 at least partially overlap with an orthographic projection of the first voltage lead line 670 on the base substrate 10. Orthographic projections of some of the plurality of second photo spacers PS2 on the base substrate 10 at least partially overlap with an orthographic projection of the auxiliary conductive portion 251 on the base substrate 10. In the embodiment, the second photo spacers PS2 are arranged in a region where the first voltage lead line is located, which may prevent the FMM from scratching the first voltage lead line and prevent the first voltage lead line from generating defects.

Referring to FIG. 8 and FIG. 9, in the first side peripheral region NA1, the orthographic projections of some of the plurality of second photo spacers PS2 on the base substrate 10 at least partially overlap with the orthographic projection of the first voltage lead line 670 on the base substrate 10. The orthographic projections of some of the plurality of second photo spacers PS2 on the base substrate 10 at least partially overlap with the orthographic projection of the auxiliary conductive portion 251 on the base substrate 10.

Referring to FIG. 11, in the third side peripheral region NA3, orthographic projections of some of the plurality of second photo spacers PS2 on the base substrate 10 at least partially overlap with the orthographic projection of the first voltage lead line 670 on the base substrate 10. Orthographic projections of some of the plurality of second photo spacers PS2 on the base substrate 10 at least partially overlap with the orthographic projection of the auxiliary conductive portion 251 on the base substrate 10.

Referring to FIG. 10, FIG. 12 and FIG. 13, the pixel defining layer PDL is schematically shown. For example, the pixel defining layer PDL may include a pixel defining layer body PDL0 and a first covering portion PDL1. Most of the pixel defining layer body PDL0 is located in the display region AA. For example, in the display region AA, the pixel defining layer PDL includes a plurality of openings. In the peripheral region NA, the pixel defining layer PDL includes the first covering portion PDL1.

For example, as shown in FIG. 3, in some exemplary embodiments of the present disclosure, the plurality of sub-pixels include the first sub-pixel SP1, the second sub-pixel SP2 and the third sub-pixel SP3, and the pixel defining layer body PDL0 includes openings located in the display region AA and corresponding to the plurality of sub-pixels. Orthographic projection of the openings on the base substrate are located within orthographic projections of the first electrodes of the plurality of sub-pixels on the base substrate. An area of the orthographic projection of the opening corresponding to the third sub-pixel SP3 on the base substrate 10 is greater than an area of the orthographic projection of the opening corresponding to the first sub-pixel SP1 or the second sub-pixel SP2 on the base substrate 10. The first photo spacer PS1 is adjacent to the opening corresponding to the third sub-pixel SP3 in the second direction Y.

It should be noted that for ease of illustration and description, FIG. 3 shows only an approximate position and shape of the opening of the pixel defining layer of the sub-pixel to indicate a distribution of each sub-pixel. For example, in some embodiments of the present disclosure, for an arrangement of sub-pixels in each pixel repetition unit, reference may be made to a conventional pixel arrangement, such as RGB, GGRB, RGBG, RGB, etc., which is not limited by embodiments of the present disclosure.

Referring to FIG. 9 and FIG. 11, exemplarily, the auxiliary conductive portion 251 may further include a plurality of openings. For example, the plurality of openings may include: first via holes 2511 located in the first side peripheral region NA1 or the second side peripheral region NA2, and second via holes 2512 located in the third side peripheral region NA3. The planarization layer PLN is generally made of an organic resin material. Some organic substances such as an organic solvent, a small molecular material, or the like, that are volatile by heat may exist in the planarization layer PLN. The organic substances may easily volatilize by heat in a subsequent manufacturing process of the display panel, resulting in a degassing of the planarization layer. A plurality of openings are provided on the first electrode layer, which is beneficial for the organic substances in the planarization layer PLN to volatilize by heat in the subsequent manufacturing process of the display panel, thereby avoiding a bubble accumulation on a surface of the first electrode layer facing the planarization layer PLN. In this way, a process yield of the display panel may be ensured, and thereby a good display effect of the display panel may be ensured.

The display panel may include a plurality of first covering portions PDL1 and a plurality of second covering portions PDL2. Orthographic projections of the plurality of first covering portions PDL1 on the base substrate cover orthographic projections of the plurality of first via holes 2511 on the base substrate, respectively, and orthographic projections of the plurality of second covering portions PDL2 on the base substrate cover orthographic projections of the plurality of second via holes 2512 on the base substrate, respectively. Edges of the first electrode layer may be covered by providing the first covering portions PDL1 and the second covering portions PDL2, so that the first electrode layer may be protected.

In embodiments of the present disclosure, the pixel defining layer body PDL0 may have a boundary PDLS away from the display region AA. For example, the plurality of sub-pixels located in the display region AA may include an outermost column of sub-pixels, that is, a column of sub-pixels closest to the peripheral region NA. The boundary PDLS is spaced from the outermost column of sub-pixels by a certain distance. For example, in regions shown in FIG. 8 and FIG. 10, a distance between the boundary PDLS and the outermost column of sub-pixels (a leftmost column of sub-pixels in FIG. 8) in the first direction X may be a specified value, or the distance falls within a specified range.

Referring to FIG. 7, FIG. 10 and FIG. 12 in combination, the pixel defining layer PDL (specifically, the pixel defining layer body PDL0) includes a first part PDL01 and a second part PDL02. The second portion PDL02 and the first portion PDL01 are formed as an integrated structure. The first part PDL01 is located in the display region AA and includes openings corresponding to the plurality of sub-pixels. Orthographic projections of the openings on the base substrate are located within the orthographic projections of the first electrodes of the plurality of sub-pixels on the base substrate. The second part PDL02 is located in the peripheral region NA.

In embodiments of the present disclosure, the orthographic projections of the first photo spacers PS1 on the base substrate are located within an orthographic projection of the first portion PDL01 of the pixel defining layer on the base substrate, and orthographic projections of some of the second photo spacer PS2 on the base substrate are located within an orthographic projection of the second portion PDL02 of the pixel defining layer on the base substrate. For example, the orthographic projections of the second photo spacers PS2 on the base substrate do not overlap with the orthographic projections of the first electrodes of the plurality of sub-pixels on the base substrate.

Referring to FIG. 10, in at least one of the first side peripheral region NA1 and the second side peripheral region NA2, orthographic projections of some of the plurality of second photo spacers PS2 on the base substrate 10 are located on a side of the outer side boundary PDLS of the pixel defining layer body close to the display region AA, and orthographic projection of some others of the plurality of second photo spacers PS2 on the base substrate 10 are located on a side of the outer side boundary PDLS of the pixel defining layer body away from the display region AA.

For the second photo spacers located on a side of the outer side boundary of the pixel defining layer body close to the display region in at least one of the first side peripheral region NA1 and the second side peripheral region NA2, in two adjacent rows of second photo spacers PS2 (two rows of second photo spacers selected by a dotted line box, as shown in FIG. a spacing distance between two second photo spacers adjacent to each other in the first direction X in a row of second photo spacers is not equal to a spacing distance between two second photo spacers adjacent to each other in the first direction X in the other row of second photo spacers.

For the second photo spacers located on a side of the outer side boundary of the pixel defining layer body away from the display region in at least one of the first side peripheral region NA1 and the second side peripheral region NA2, in two adjacent rows of second photo spacers PS2 (two rows of second photo spacers selected by a chain-dotted line box, as shown in FIG. 10), a spacing distance between two second photo spacers adjacent to each other in the first direction in a row of second photo spacers is substantially equal to a spacing distance between two second photo spacers adjacent to each other in the first direction in the other row of second photo spacers.

It should be noted that an expression "substantially equal" used herein may mean that the two objects being compared are strictly equal to each other, or the two objects being compared are approximately equal to each other. Specifically, here, the spacing distance between two second photo spacers adjacent to each other in the first direction in a row of second photo spacers being substantially equal to the spacing distance between two second photo spacers adjacent to each other in the first direction in the other row of second photo spacers may include that: a ratio between the spacing distance between two second photo spacers adjacent to each other in the first direction in a row of second photo spacers and the spacing distance between two second photo spacers adjacent to each other in the first direction in the other row of second photo spacers is in a range of 0.8 to 1.2.

Referring to FIG. 10, in at least one of the first side peripheral region NA1 and the second side peripheral region NA2, the orthographic projections of some of the plurality of second photo spacers PS2 on the base substrate at least partially overlap with an orthographic projection of the first covering portion PDL1 on the base substrate.

Referring to FIG. 12, in the third side peripheral region NA3, the orthographic projections of some of the plurality of second photo spacers PS2 on the base substrate at least partially overlap with an orthographic projection of the second covering portion PDL2 on the base substrate.

Referring to FIG. 11 and FIG. 12, in the third side peripheral region NA3, the pixel defining layer PDL further includes a third covering portion PDL3. The auxiliary conductive portion includes a plurality of third openings 2513, the plurality of third openings 2513 respectively expose a part of the planarization layer, and the third covering portion PDL3 covers the plurality of third openings 2513.

In the third side peripheral region NA3, the orthographic projections of some of the plurality of second photo spacers PS2 on the base substrate do not overlap with orthographic projections of the plurality of third openings 2513 on the base substrate.

Referring to FIG. 13, in the fourth peripheral region NA4, the pixel defining layer PDL further includes a fourth covering portion PDL4. The auxiliary conductive portion includes a plurality of fourth openings 2514, the plurality of fourth openings 2514 respectively expose a part of the planarization layer, and the fourth covering portion PDL4 covers the plurality of fourth openings 2514.

In the fourth peripheral region NA4, orthographic projections of some of the plurality of second photo spacers PS2 on the base substrate at least partially overlap with an orthographic projection of the fourth covering portion PDL4 on the base substrate.

In some other embodiments of the present disclosure, a display device is further provided. The display device may include the above-mentioned display panel. For example, the display device may be a smart phone, a mobile phone, a video phone, an e-book reader, a desktop computer (PC), a laptop PC, a netbook PC, a personal digital assistant (PDA), a portable multimedia player (PMP), a digital audio player, a mobile medical apparatus, a camera, a wearable apparatus (such as a headset apparatus, an electronic clothing, an electronic bracelet or smart watch), etc.

Although some embodiments according to the general inventive concept of the present disclosure have been illustrated and described, those skilled in the art may understand that the embodiments may be changed without departing from the principle and spirit of the general inventive concept of the present disclosure. The scope of the present disclosure is limited by the claims and their equivalents.

What is claimed is:

1. A display panel, comprising:
a base substrate comprising a display region and a peripheral region, wherein the display region comprises an outer boundary;
a plurality of sub-pixels arranged in the display region, wherein the plurality of sub-pixels are arranged in an array in a first direction and a second direction in the display region, and at least one of the sub-pixels comprises a first electrode, a second electrode and a functional layer located between the first electrode and the second electrode;
a first electrode layer arranged on the base substrate, wherein the first electrodes of the plurality of sub-pixels are located in the first electrode layer;
a pixel defining layer arranged on a side of the first electrode layer away from the base substrate; and
a photo spacer layer arranged on a side of the pixel defining layer away from the base substrate,
wherein the display panel further comprises at least one barrier dam arranged on the base substrate, and the at least one barrier dam is located on a side of the peripheral region away from the display region in the peripheral region;
wherein in the first direction and the second direction, the outer boundary is adjacent to an outermost row of sub-pixels located in the display region, and the outermost row of sub-pixels located in the display region faces a side of the peripheral region;
wherein the photo spacer layer comprises a plurality of first photo spacers and a plurality of second photo spacers, the plurality of first photo spacers are arranged in an array in the display region, the plurality of second photo spacer are arranged in an array in the peripheral region, and the plurality of second photo spacers are located between the outer boundary and the at least one barrier dam; and
wherein a distribution density of the plurality of second photo spacers in the peripheral region is less than a distribution density of the plurality of first photo spacers in the display region.

2. The display panel according to claim 1, wherein two first photo spacers adjacent to each other in the first direction are spaced by a first distance in the first direction, two second photo spacers adjacent to each other in the first direction are spaced by a second distance in the first direction, and the first distance is less than the second distance; and/or
wherein two first photo spacers adjacent to each other in the second direction are spaced by a third distance in the second direction, two second photo spacers adjacent to each other in the second direction are spaced by a fourth distance in the second direction, and the third distance is less than the fourth distance.

3. The display panel according to claim 1, wherein an outermost row of second photo spacers are spaced from the at least one barrier dam.

4. The display panel according to claim 3, wherein the display panel further comprises a drive voltage lead line arranged in the peripheral region on the base substrate, and the drive voltage lead line is configured to transmit a drive voltage; and wherein an orthographic projection of at least one of the plurality of second photo spacers on the base substrate at least partially overlaps with an orthographic projection of the drive voltage lead line on the base substrate.

5. The display panel according to claim 3, wherein the peripheral region comprises a first side peripheral region and a second side peripheral region, and the first side peripheral region and the second side peripheral region are located on two sides of the display region in the first direction, respectively;

wherein the display panel further comprises a scan drive circuit located in at least one of the first side peripheral region and the second side peripheral region on the base substrate, and the scan drive circuit is configured to output a scan signal;

wherein the peripheral region comprises a scan drive circuit region, the scan drive circuit region is located in at least one of the first side peripheral region and the second side peripheral region, the scan drive circuit is arranged in a scan drive circuit region, and the scan drive circuit region is located between the drive voltage lead line and the at least one barrier dam; and wherein an orthographic projection of at least one of the plurality of second photo spacers on the base substrate at least partially overlaps with an orthographic projection of the scan drive circuit region on the base substrate;

wherein a plurality of scan drive circuit regions are arranged in at least one of the first side peripheral region and the second side peripheral region; and wherein the orthographic projection of at least one of the plurality of second photo spacers on the base substrate at least partially overlaps with an orthographic projection of each of the plurality of scan drive circuit regions on the base substrate.

6. The display panel according to claim 5, wherein the display panel further comprises a first voltage lead line and an auxiliary conductive portion, the first voltage lead line is configured to provide a first voltage, the auxiliary conductive portion and the first electrode are located in a same layer, and a part of the auxiliary conductive portion is in direct contact with the first voltage lead line; and wherein the orthographic projection of at least one of the plurality of second photo spacers on the base substrate at least partially overlaps with an orthographic projection of the first voltage lead line on the base substrate; and/or, the orthographic projection of at least one of the plurality of second photo spacers on the base substrate at least partially overlaps with an orthographic projection of the auxiliary conductive portion on the base substrate.

7. The display panel according to claim 3, wherein the pixel defining layer comprises a pixel defining layer body, the pixel defining layer body comprises a first part and a second part, the first part is located in the display region and comprises openings corresponding to the plurality of sub-pixels, and an orthographic projection of the openings on the base substrate is located within an orthographic projection of the first electrodes of the plurality of sub-pixels on the base substrate; the second part is located in the peripheral region, and the second part and the first part are an integrated structure; and the pixel defining layer body comprises an outer side boundary away from the display region;

wherein the peripheral region comprises a first side peripheral region and a second side peripheral region, and the first side peripheral region and the second side peripheral region are located on two sides of the display region in the first direction, respectively; and wherein in at least one of the first side peripheral region and the second side peripheral region, the orthographic projection of at least one of the plurality of second photo spacers on the base substrate is located on a side of the outer side boundary of the pixel defining layer body close to the display region, and an orthographic projection of at least another one of the plurality of second photo spacers on the base substrate is located on a side of the outer side boundary of the pixel defining layer body away from the display region.

8. The display panel according to claim 7, wherein for the second photo spacers located on a side of the outer side boundary of the pixel defining layer body close to the display region in at least one of the first side peripheral region and the second side peripheral region, in two adjacent rows of second photo spacers, a spacing distance between two second photo spacers adjacent to each other in the first direction in a row of second photo spacers is not equal to a spacing distance between two second photo spacers adjacent to each other in the first direction in the other row of second photo spacers.

9. The display panel according to claim 7, wherein for the second photo spacers located on a side of the outer side boundary of the pixel defining layer body close to the display region in at least one of the first side peripheral region and the second side peripheral region, in two adjacent rows of second photo spacers, a spacing distance between two second photo spacers adjacent to each other in the first direction in a row of second photo spacers is substantially equal to a spacing distance between two second photo spacers adjacent to each other in the first direction in the other row of second photo spacers.

10. The display panel according to claim 7, wherein the display panel further comprises a planarization layer, and the planarization layer is located on a side of the first electrode layer close to the base substrate;

wherein in at least one of the first side peripheral region and the second side peripheral region, the auxiliary conductive portion comprises a plurality of first openings, and the plurality of first openings respectively expose a part of the planarization layer; and the pixel defining layer further comprises a first covering portion, and the first covering portion covers the plurality of first openings; and wherein an orthographic projection of at least one of the plurality of second photo spacers on the base substrate at least partially overlaps with an orthographic projection of the first covering portion on the base substrate.

11. The display panel according to claim 10, wherein the peripheral region comprises a third peripheral region, and the third peripheral region is located on a side of the display region in the second direction;

wherein in the third side peripheral region, the pixel defining layer further comprises a second covering portion, the auxiliary conductive portion comprises a plurality of second openings, the plurality of second openings respectively expose a part of the planarization layer, and the second covering portion covers the plurality of second openings; and wherein in the third side peripheral region, the orthographic projection of at least one of the plurality of second photo spacers on the base substrate at least partially overlaps with an orthographic projection of the second covering portion on the base substrate.

12. The display panel according to claim 11, wherein in the third side peripheral region, the pixel defining layer further comprises a third covering portion, the auxiliary conductive portion comprises a plurality of third openings, the plurality of third openings respectively expose a part of the planarization layer, and the third covering portion covers the plurality of third openings; and wherein in the third side peripheral region, the orthographic projection of at least one of the plurality of second photo spacers on the base substrate does not overlap with an orthographic projection of the plurality of third openings on the base substrate.

13. The display panel according to claim 12, wherein the peripheral region comprises a fourth peripheral region, and the fourth peripheral region is located on the other side of the display region in the second direction;

wherein in the fourth side peripheral region, the pixel defining layer further comprises a fourth covering portion, the auxiliary conductive portion comprises a plurality of fourth openings, the plurality of fourth openings respectively expose a part of the planarization layer, and the fourth covering portion covers the plurality of fourth openings; and wherein in the fourth side peripheral region, the orthographic projection of at least one of the plurality of second photo spacers on the base substrate at least partially overlaps with an orthographic projection of the fourth covering portion on the base substrate.

14. The display panel according to claim 5, wherein at least one row of second photo spacers located in at least one of the first side peripheral region and the second side peripheral region are substantially aligned with at least one row of first photo spacers located in the display region in the first direction, respectively.

15. The display panel according to claim 11, wherein at least one column of second photo spacers located in the third side peripheral region are substantially aligned with at least one column of first photo spacers located in the display region in the second direction, respectively.

16. The display panel according to claim 11, wherein the peripheral region comprises a fourth peripheral region, and the fourth peripheral region is located on the other side of the display region in the second direction; and wherein in the first side peripheral region, the second side peripheral region, the third side peripheral region and the fourth side peripheral region, spacing distances between an orthographic projection of the outermost row of second photo spacers on the base substrate and an orthographic projection of the at least one barrier dam on the base substrate are substantially equal to each other.

17. The display panel according to claim 3, wherein a spacing distance between an orthographic projection of the outermost row of second photo spacers on the base substrate and an orthographic projection of the at least one barrier dam on the base substrate is in a range of 300 microns to 1000 microns.

18. The display panel according to claim 1, wherein the distribution density of the plurality of second photo spacers in the peripheral region is 1/4 to 2/3 of the distribution density of the plurality of first photo spacers in the display region.

19. The display panel according to claim 1, wherein the plurality of sub-pixels comprises a first sub-pixel, a second sub-pixel and a third sub-pixel, the pixel defining layer body comprises openings corresponding to the plurality of sub-pixels in the display region, an orthographic projection of the openings on the base substrate is located within an orthographic projection of the first electrodes of the plurality of sub-pixels on the base substrate, and an area of the orthographic projection of the opening corresponding to the third sub-pixel on the base substrate is greater than an area of the orthographic projection of the opening corresponding to the first sub-pixel or the second sub-pixel on the base substrate;

wherein the first photo spacer is adjacent to the opening corresponding to the third sub-pixel in the second direction;

wherein the display panel further comprises an encapsulation layer arranged on a side of the at least one barrier dam away from the base substrate, and the encapsulation layer comprises a first inorganic layer, an organic layer and a second inorganic layer stacked in sequence; and wherein an orthographic projection of the organic layer on the base substrate is located on a side of an orthographic projection of the at least one barrier dam on the base substrate close to the display region, and the at least one barrier dam is configured to block a flow of an organic solution configured to form the organic layer in a direction from the display region to the peripheral region.

20. A display device, comprising the display panel according to claim 1.

* * * * *